(12) United States Patent
Won

(10) Patent No.: US 11,221,645 B2
(45) Date of Patent: Jan. 11, 2022

(54) DISPLAY DEVICE AND METHOD OF MANUFACTURING THE SAME

(71) Applicant: Samsung Display Co., LTD., Yongin-si (KR)

(72) Inventor: Chang Hee Won, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/811,553

(22) Filed: Mar. 6, 2020

(65) Prior Publication Data

US 2020/0401185 A1 Dec. 24, 2020

(30) Foreign Application Priority Data

Jun. 21, 2019 (KR) .......................... 10-2019-0073857

(51) Int. Cl.
  *G06F 1/16* (2006.01)
  *H01L 27/32* (2006.01)
  *G02B 1/14* (2015.01)

(52) U.S. Cl.
  CPC ............. *G06F 1/1609* (2013.01); *G02B 1/14* (2015.01); *G06F 1/1626* (2013.01); *G06F 1/1652* (2013.01); *H01L 27/3225* (2013.01)

(58) Field of Classification Search
  CPC ..... G06F 1/1607; G06F 1/1637; G06F 1/1652
  See application file for complete search history.

(56) References Cited

U.S. PATENT DOCUMENTS

| 7,217,990 | B2 * | 5/2007 | Chung | H01L 22/32 257/667 |
| 10,936,136 | B2 * | 3/2021 | Myers | G06F 1/1643 |
| 2008/0055831 | A1 * | 3/2008 | Satoh | H05K 1/0281 361/600 |
| 2011/0007042 | A1 * | 1/2011 | Miyaguchi | H01L 27/1218 345/204 |
| 2011/0050657 | A1 * | 3/2011 | Yamada | H01L 51/5237 345/204 |

(Continued)

FOREIGN PATENT DOCUMENTS

| KR | 10-2014-0085956 | 7/2014 |
| KR | 10-1801688 | 11/2017 |

(Continued)

*Primary Examiner* — Adrian S Wilson
(74) *Attorney, Agent, or Firm* — Kile Park Reed & Houtteman PLLC

(57) ABSTRACT

A display device and a method of manufacturing the display device are provided. The method includes disposing a display panel, including side areas, a front display area, and a sub-region, on a carrier film including first, second, and third release portions; removing the first release portion to expose the side areas; disposing a cover window above the display panel; attaching the front display area to the cover window by pressing the second release portion toward the cover window, and attaching the side areas to the cover window by pressing the side areas exposed by removing the first release portion toward the cover window; removing the second release portion and the third release portion to expose the front display area and the sub-region; and bending the display panel to attach a bottom portion of the sub-region to a bottom portion of the front display area.

13 Claims, 26 Drawing Sheets

(56) References Cited

U.S. PATENT DOCUMENTS

| | | | | |
|---|---|---|---|---|
| 2013/0002133 A1* | 1/2013 | Jin | ............... | G06F 1/1626 |
| | | | | 313/511 |
| 2013/0002572 A1* | 1/2013 | Jin | ............... | G02F 1/133305 |
| | | | | 345/173 |
| 2013/0148312 A1* | 6/2013 | Han | ............... | H05K 1/028 |
| | | | | 361/736 |
| 2013/0169515 A1* | 7/2013 | Prushinskiy | ............... | H01L 51/56 |
| | | | | 345/55 |
| 2013/0342429 A1* | 12/2013 | Choi | ............... | H05K 13/00 |
| | | | | 345/30 |
| 2013/0343012 A1* | 12/2013 | Park | ............... | H05K 7/1422 |
| | | | | 361/750 |
| 2014/0152646 A1* | 6/2014 | Kang | ............... | H01L 51/52 |
| | | | | 345/214 |
| 2014/0183473 A1* | 7/2014 | Lee | ............... | H01L 27/3267 |
| | | | | 257/40 |
| 2017/0162821 A1* | 6/2017 | Oh | ............... | H01L 51/5256 |
| 2020/0176362 A1* | 6/2020 | Tsai | ............... | H01L 23/4985 |

FOREIGN PATENT DOCUMENTS

| | | |
|---|---|---|
| KR | 10-1801689 | 11/2017 |
| KR | 10-1801690 | 11/2017 |

* cited by examiner

DISPLAY DEVICE AND METHOD OF MANUFACTURING THE SAME

CROSS-REFERENCE TO RELATED APPLICATION

This application claims priority to and benefits from Korean Patent Application No. 10-2019-0073857 under 35 U.S.C. § 119, filed on Jun. 21, 2019 in the Korean Intellectual Property Office, the entire contents of which are herein incorporated by reference.

BACKGROUND

1. Technical Field

The present disclosure relates to a display device and a method of manufacturing thereof, and more specifically, to a display device and method of manufacturing thereof that optimize bonding between one or more areas of the display device.

2. Description of the Related Art

The importance of display devices has steadily increased with the development of multimedia technology. Accordingly, various types of display devices such as a liquid crystal display (LCD), an organic light emitting display (OLED) and the like have been implemented in applications of such multimedia technology.

Among the display devices, the organic light emitting display device displays an image using an organic light emitting diode (OLED) that generates light by recombination of electrons and holes. The organic light emitting display device has a fast response speed, a high luminance and a large viewing angle, and can be driven with low power consumption.

Generally, a display device displays an image only on a front portion. However, a display device which displays an image on a side portion has been developed.

SUMMARY

Aspects of the disclosure provide a display device capable of preventing non-bonding defects and bubble defects occurring in side areas and corner areas of the display device which may display an image in such areas.

Aspects of the disclosure also provide a method of manufacturing a display device capable of preventing non-bonding defects and bubble defects occurring in side areas and corner areas of the display device where an image may be displayed.

However, aspects of the disclosure may not be restricted to those set forth herein. The above and other aspects of the disclosure will become more apparent to one of ordinary skill in the art to which the disclosure pertains by referencing the detailed description of the disclosure given below.

According to an embodiment of the disclosure, a method of manufacturing a display device may include disposing a display panel, including side areas, a front display area, and a sub-region, on a carrier film including a first release portion, a second release portion and a third release portion; removing the first release portion of the carrier film to expose the side areas of the display panel; disposing a cover window above the display panel; attaching the front display area of the display panel to the cover window by pressing the second release portion of the carrier film toward the cover window, and attaching the side areas to the cover window by pressing the side areas exposed by removing the first release portion toward the cover window; removing the second release portion and the third release portion to expose the front display area and a sub-region of the display panel; and bending the display panel to attach a bottom portion of the sub-region to a bottom portion of the front display area.

The method may further include forming a first cutting line between the first release portion and the second release portion and forming a second cutting line between the second release portion and the third release portion.

The forming a first cutting line may include cutting the carrier film along boundaries between the front display area and the side areas of the display panel.

The forming a second cutting line may include cutting the carrier film along a boundary between the side area of the display panel and a bending region where the display panel may be bent.

The disposing a display panel may include forming a cutout portion in a corner area disposed between the side areas of the display panel.

The display panel may include a substrate and a first protective film disposed on the substrate, and the forming a cutout portion may include cutting a cutout pattern that may be an area of the first protective film corresponding to the cutout portion in a thickness direction of the display panel.

According to another embodiment of the disclosure, a method of manufacturing a display device may include disposing a display panel, including a front display area, side areas, and a sub-region, on a carrier film including a first release portion, a second release portion and a third release portion; forming a cutout pattern in the first release portion of the carrier film to overlap the side areas of the display panel; disposing a cover window above the display panel; attaching the side areas of the display panel to the cover window by pressing the first release portion of the carrier film toward the cover window, and attaching the front display area of the display panel to the cover window by pressing the second release portion of the carrier film toward the cover window; removing the first release portion, the second release portion and the third release portion of the carrier film to expose the front display area, the side areas and the sub-region; and bending the display panel to attach a bottom portion of the sub-region of the display panel to a bottom portion of the front display area.

The forming a cutout pattern in the first release portion may include cutting the first release portion into a grid configuration.

The display panel may include a substrate and a first protective film disposed on the substrate, and the method may further include forming a cutout pattern in side areas of the first protective film.

The forming a cutout pattern in the first release portion may be performed simultaneously with the forming a cutout pattern in the first protective film.

According to an embodiment of the disclosure, a display device may include a display panel including a front display area, a first side area extending from a first side of the front display area, a second side area extending from a second side of the front display area, and a corner area disposed between the first side area and the second side area, wherein the display panel may include a cutout portion which cuts the corner area in a thickness direction of the display panel.

The display panel may further include a substrate and a first protective film attached to a surface of the substrate, and the first protective film may include a cutout pattern overlapping the cutout portion.

The cutout pattern of the first protective film may cut the first protective film in the thickness direction of the display panel from one side of the corner area to another side of the corner area.

The one side of the corner area and the another side of the corner area may respectively correspond to first and second ends of the corner area.

The substrate may include a cutout pattern overlapping the cutout portion.

The cutout pattern of the substrate may cut the substrate in the thickness direction of the display panel from a first end of the corner area to a second end of the corner area.

The cutout pattern of the first protective film may overlap the first side area and the second side area.

The cutout pattern of the first protective film may be a cutout pattern having a grid configuration in plan view.

The display panel may further include a second protective film attached to one surface of the substrate, the substrate may include a bending region, a main region located at one side of the bending region, and a sub-region extending from another side of the bending region, and the first protective film may be attached to the main region of the substrate, and the second protective film may be attached to the sub-region of the substrate.

The second protective film may overlap the first protective film in the thickness direction of the display panel.

The display panel may include a first adhesive layer disposed between the substrate and the first protective film, a second adhesive layer disposed between the substrate and the second protective film, and a third adhesive layer disposed between the first protective film and the second protective film.

According to embodiments of the disclosure, since the display panel may include a cutout portion, it may be possible to prevent or minimize non-bonding defects and bubble defects occurring in side areas and corner areas of the display device.

Effects of the disclosure may not be limited to the above-described effects and other effects which may not be described herein will become apparent to those skilled in the art from the following description.

BRIEF DESCRIPTION OF THE DRAWINGS

The above and other aspects and features of the disclosure will become more apparent by describing embodiments thereof with reference to the accompanying drawings, in which.

DETAILED DESCRIPTION OF THE EMBODIMENTS

Figure 1:
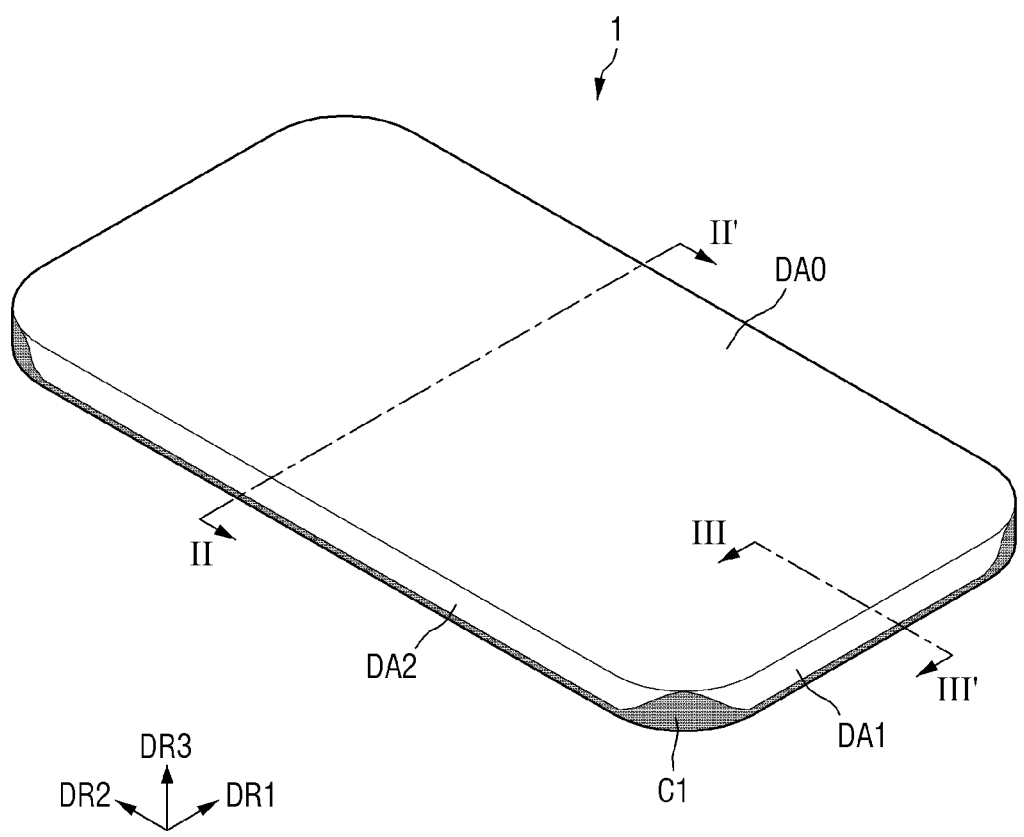
FIG. 1 shows a perspective view of a display device according to an embodiment.

The disclosure will now be described more fully hereinafter with reference to the accompanying drawings, in which embodiments of the disclosure are shown. This invention may, however, be embodied in different forms and should not be construed as limited to the embodiments set forth herein. Rather, these embodiments are provided so that this disclosure will be thorough and complete, and will fully convey the scope of the referenced embodiments to those skilled in the art.

Reference will now be made in detail to embodiments, examples of which may be illustrated in the accompanying drawings, wherein like reference numerals refer to like elements throughout. In this regard, the embodiments may have different forms and should not be construed as being limited to the descriptions set forth herein. Accordingly, the embodiments may be described below, by referring to the figures, to explain aspects of the description. As used herein, the term "and/or" includes any and all combinations of one or more of the associated listed items. Expressions such as "at least one of," when preceding a list of elements, modify the entire list of elements and do not modify the individual elements of the list.

It will be understood that the terms "first," "second," etc. may be used herein to describe various components, these components should not be limited by these terms. These terms may only be used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, area, or component is referred to as being "formed on," another layer, area, or component, it can be directly or indirectly formed on the other layer, area, or component. That is, for example, intervening layers, areas, or components may be present.

Sizes of elements in the drawings may be exaggerated for convenience of explanation. In other words, since sizes and thicknesses of components in the drawings may be arbitrarily illustrated for convenience of explanation, the following embodiments may not be limited thereto.

When a certain embodiment may be implemented differently, a specific process order may be performed differently from the described order. For example, two consecutively described processes may be performed substantially at the same time or performed in an order opposite to the described order.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it may be directly or indirectly in contact with or electrically connected to the other element, area, or layer.

Further, in the specification, the phrase "in a plan view" means when an object portion is viewed from above, and the phrase "in a cross-sectional view" means when a cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

As used herein, "first direction DR1" may refer to an X-axis direction, "second direction DA2" may refer to a Y-axis direction, and "third direction DR3" may refer to a Z-axis direction.

Figure 2:
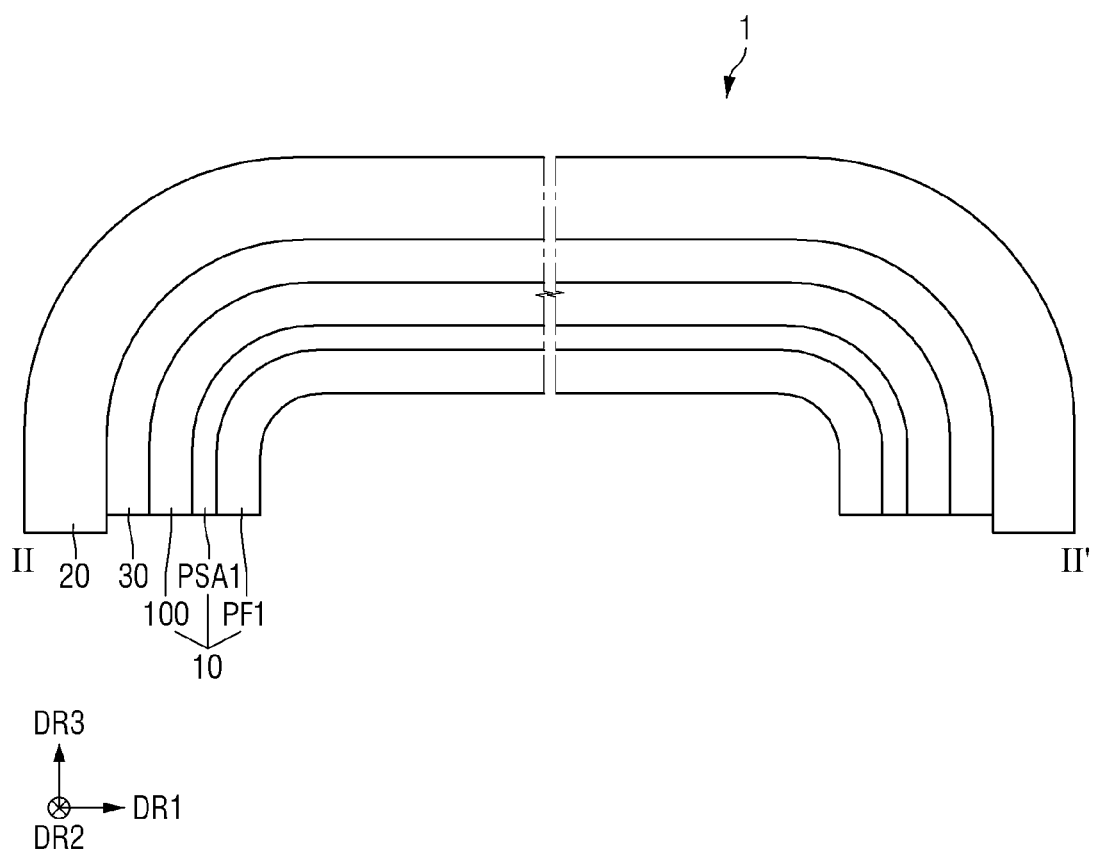
FIG. 2 shows a schematic cross-sectional view taken along line II-IF of FIG. 1.
Figure 3:
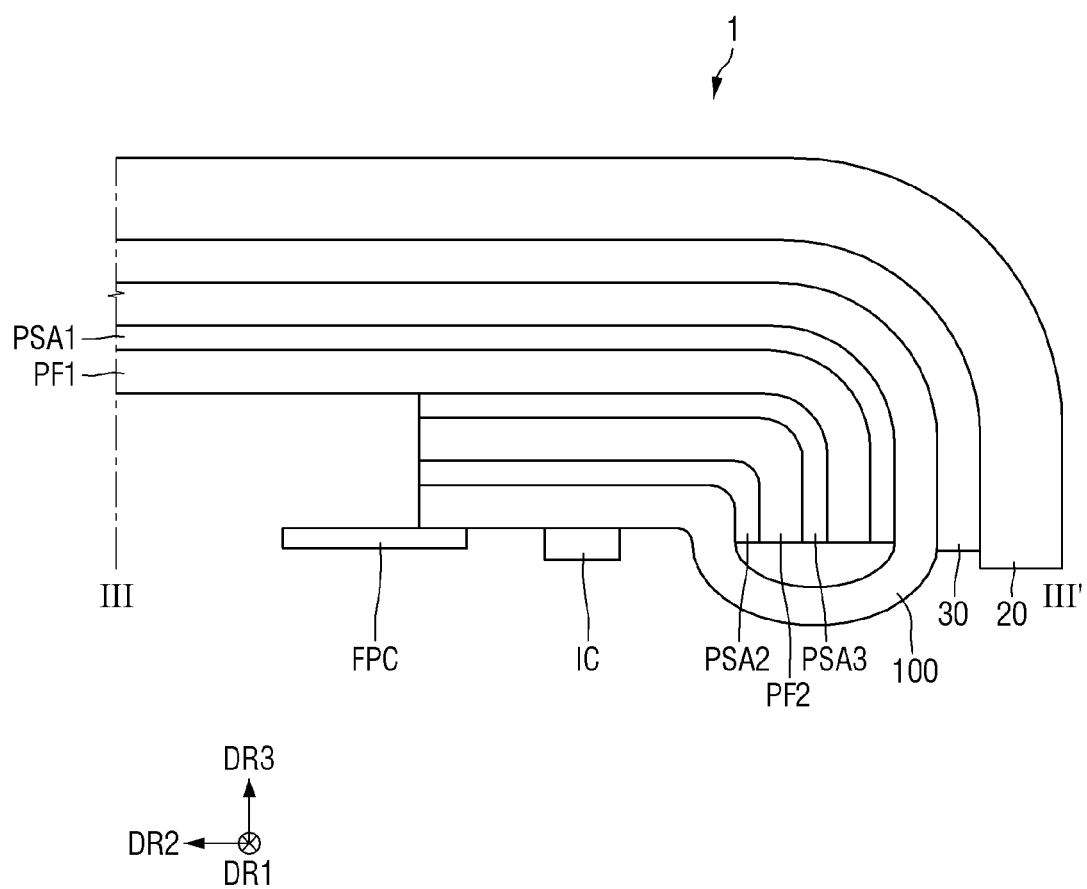
FIG. 3 shows a schematic cross-sectional view taken along line III-III' of FIG. 1.
Figure 4:
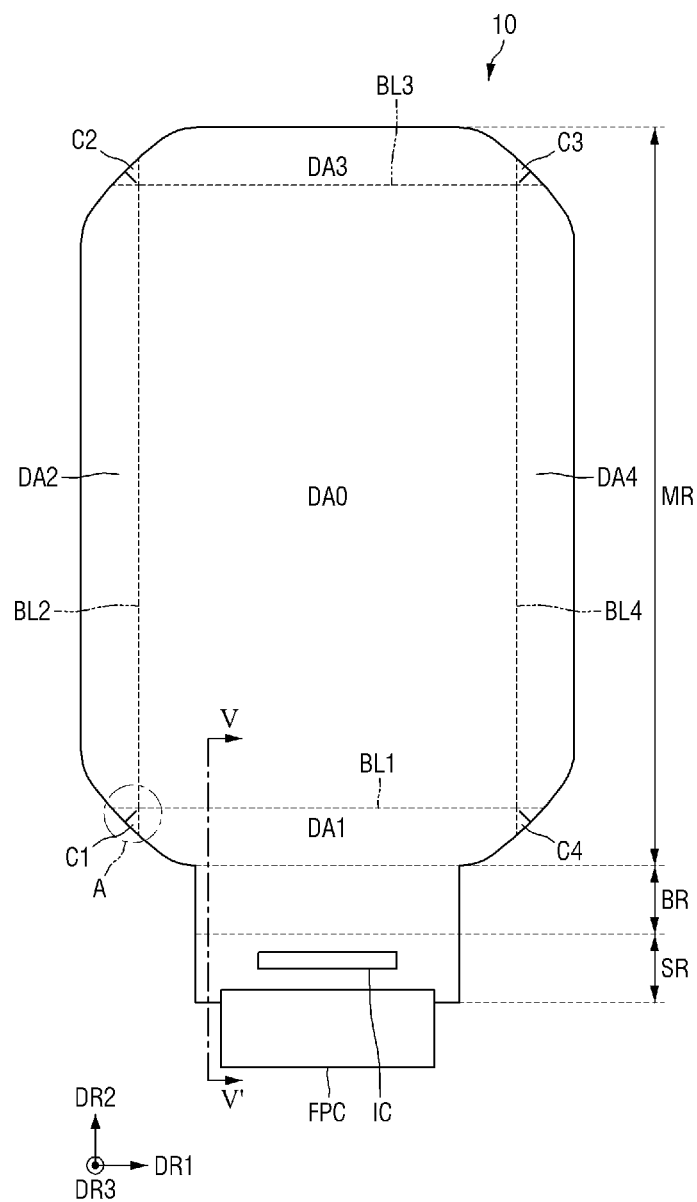
FIG. 4 shows a development view of a display panel according to an embodiment.
Figure 5:
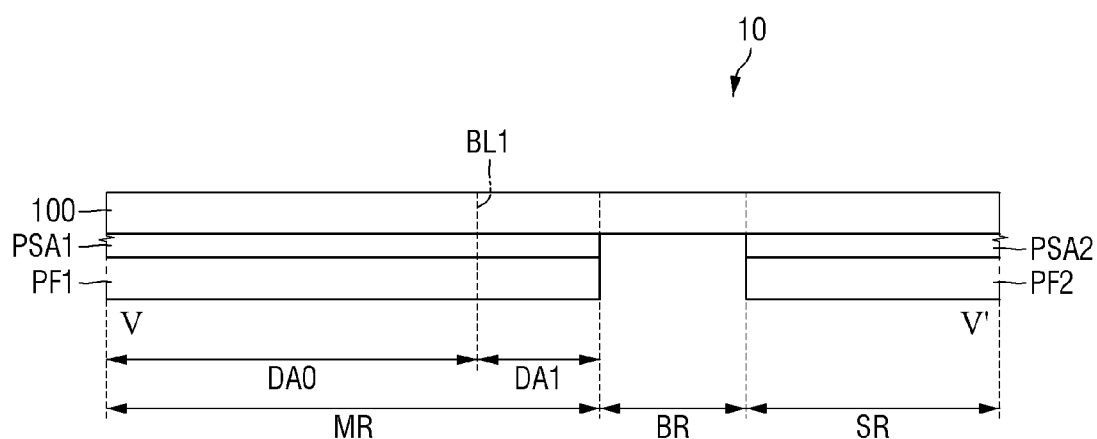
FIG. 5 shows a schematic cross-sectional view taken along line V-V' of FIG. 4.
Figure 6:
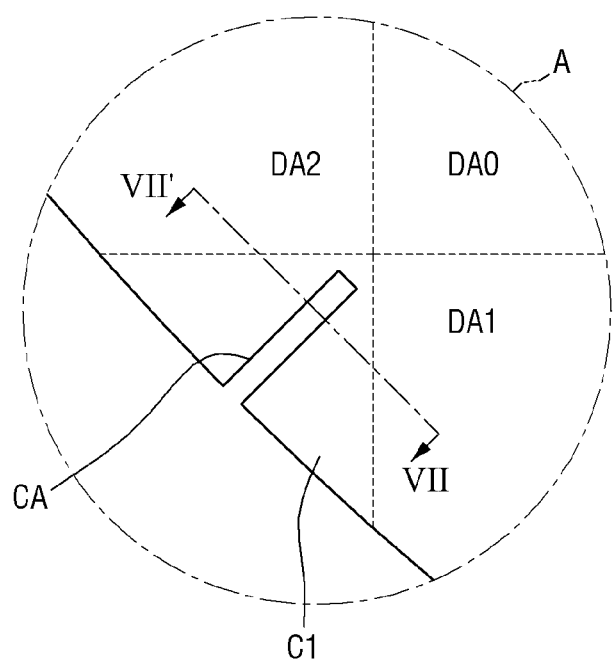
FIG. 6 shows an enlarged plan view of region A of FIG. 2.
Figure 7:
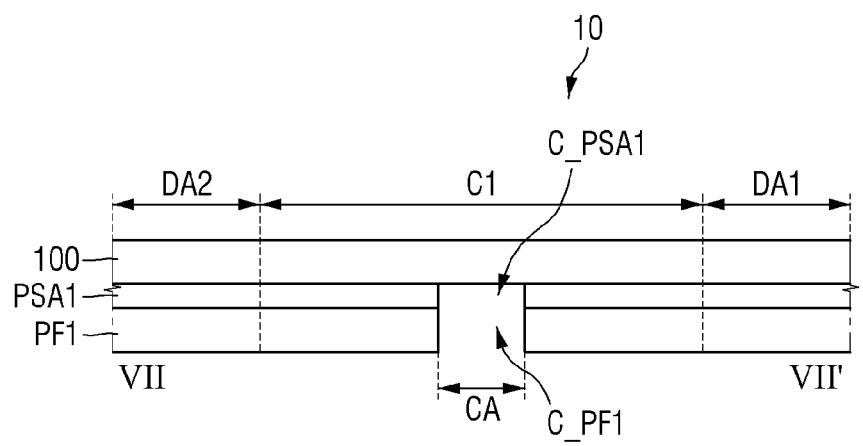
FIG. 7 shows a schematic cross-sectional view taken along line VII-VII' of FIG. 6.

FIG. 1 shows a perspective view of a display device according to an embodiment. FIG. 2 shows a schematic cross-sectional view taken along line II-II' of FIG. 1. FIG. 3 shows a schematic cross-sectional view taken along line III-III' of FIG. 1. FIG. 4 shows a development view of a display panel according to an embodiment. FIG. 5 shows a schematic cross-sectional view taken along line V-V' of FIG. 4. FIG. 6 shows an enlarged plan view of region A of FIG. 2. FIG. 7 shows a schematic cross-sectional view taken along line VII-VII' of FIG. 6.

Referring to FIGS. 1 to 7, a display device 1 may be a device for displaying a moving image or a still image. Examples of the display device 1 may include various devices which provide a display screen, such as a television, a laptop computer, a monitor, a billboard and an Internet-of-Things device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 1 may include a front display area DA0, side display areas DA1, DA2, DA3 and DA4, and corner areas C1, C2, C3 and C4. The front display area DA0 and the side display areas DA1, DA2, DA3 and DA4 may be display areas for displaying an image.

The front display area DA0 may have a rectangular shape including two short sides extending in the first direction DR1 and two long sides extending in the second direction DR2. However, the disclosure may not be limited thereto. For example, the front display area DA0 may have a polygonal shape with rounded corners, each corner where the short side and the long side meet.

The side display areas DA1, DA2, DA3 and DA4 may include a first side display area DA1, a second side display area DA2, a third side display area DA3 and a fourth side display area DA4.

The first side display area DA1 may be an area extending from the edge of the front display area DA0 in a direction opposite to the second direction DR2, and the second side display area DA2 may be an area extending from the edge of the front display area DA0 in a direction opposite to the first direction DR1. The third side display area DA3 may be an area extending from the edge of the front display area DA0 in the second direction DR2, and the fourth side display area DA4 may be an area extending from the edge of the front display area DA0 in the second direction DR2.

The first to fourth side display areas DA1, DA2, DA3 and DA4 may have substantially the same function or configuration except for their positions. Hereinafter, common features of the first to fourth side display areas DA1, DA2, DA3 and DA4 will be described on the basis of the first side display area DA1.

The first side display area DA1 may extend outward from the edge of the front display area DA0 and may be bent at a predetermined angle. For example, the first side display area DA1 may be bent at an angle of about 90 degrees to about 150 degrees with respect to the front display area DA0. The first side display area DA1 may be a surface bent at a predetermined curvature from a first bending line BL1. The first bending line BL1 may be a boundary between the front display area DA0 and the first side display area DA1.

The first to fourth corner areas C1, C2, C3 and C4 may be located between the first to fourth side display areas DA1, DA2, DA3 and DA4. The first to fourth corner areas C1, C2, C3 and C4 may have substantially the same function or configuration except for their positions. Hereinafter, common features of the first to fourth corner areas C1, C2, C3 and C4 will be described on the basis of the first corner area C1.

The first corner area C1 may extend from the front display area DA0 and be rounded to have a predetermined curvature. The first corner area C1 may be located between the first side display area DA1 and the second side display area DA2. One end of the first corner area C1 may be in contact with the first side display area DA1, and the other end of the first corner area C1 may be in contact with the second side display area DA2. For example, one end of the first corner area C1 may be in contact with a second bending line BL2, and the other end of the first corner area C1 may be in contact with the first bending line BL1. The curvature of the first corner area C1 with respect to the front display area DA0 may be greater than the curvature of the first side display area DA1 and the second side display area DA2 with respect to the front display area DA0. The first corner area C1 may include a cutout area formed by partially cutting the display panel 10. Accordingly, even if the curvature of the first corner area C1 may be large, it may be possible to prevent or minimize non-bonding defects and bubble defects occurring in the first corner area C1 of the display device 1.

The display device 1 may include a display panel 10 and a cover window 20 disposed on the display panel 10.

The cover window 20 may cover and protect the display panel 10.

The cover window 20 may be made of a transparent material. The cover window 20 may include, for example, glass or plastic. When the cover window 20 includes plastic, the cover window 20 may be flexible.

Examples of plastics applicable to the cover window 20 may include polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, polyethersulphone (PES), polyetherimide (PEI), polyphenylene sulfide (PPS), polyarylate (PAR), triacetyl cellulose (TAC), and cellulose acetate propionate (CAP). The plastic window may include one or more of the plastic materials listed above. In a case that the cover window 20 may include plastic, it may further include a coating layer (not shown) disposed on the upper and lower surfaces of the plastic. In one embodiment, the coating layer may be a hard coating layer including an organic layer and/or an organic-inorganic hybrid layer including an acrylate compound and the like.

The planar shape of the cover window 20 may correspond to the shape of the display device 1 to which it is applied. For example, in a case that the display device 1 may have a substantially rectangular shape in plan view, the cover window 20 may also have a substantially rectangular shape. As another example, in a case that the display device 1 may have a circular shape, the cover window 20 may also have a circular shape. In a case that the display device 1 may include the side display areas DA1, DA2, DA3 and DA4 and the corner areas C1, C2, C3 and C4, the cover window 20 may include side portions corresponding to the side display areas DA1, DA2, DA3 and DA4 and corner portions corresponding to the corner areas C1, C2, C3 and C4. The side portion and the corner portion of the cover window 20 may be formed of a curved surface, and therefore may have a constant curvature or a varying curvature. The curvature of the corner portion may be greater than the curvature of the side portion.

The display panel 10 may be disposed below the cover window 20. The cover window 20 and the display panel 10 may be coupled through an adhesive member 30. The adhesive member 30 may be an optically clear adhesive (OCA) or an optically clear resin (OCR).

The display panel 10 may be a light emitting display panel including a light emitting element. For example, the display panel 10 may be an organic light emitting display panel using an organic light emitting diode, a micro light emitting diode display panel using a micro LED, a quantum dot organic light emitting display panel using a quantum dot and an organic light emitting diode, or an inorganic light emitting display panel using an inorganic semiconductor as a light emitting element. Hereinafter, a case where the display panel 10 is an organic light emitting display panel will be mainly described.

The display panel 10 may include a flexible substrate 100 including a flexible polymer material such as polyimide. Accordingly, the display panel 10 may be bent, folded or rolled.

The display panel 10 may include a bending region BR, which may be a region in which the display panel 10 may be bent. The display panel 10 may be divided into a main region MR located at one side of the bending region BR and a sub-region SR located at another side of the bending region BR.

The front display area DA0 and the side display areas DA1, DA2, DA3 and DA4 of the display panel 10 may be disposed in the main region MR. In one embodiment, the entire sub-region SR, the entire bending region BR and a peripheral edge portion of the side display areas DA1, DA2, DA3 and DA4 in the main region MR may be non-display areas. However, the disclosure may not be limited thereto. For example, the bending region BR and/or the sub-region SR may also include a display area.

The bending region BR may be connected to the main region MR in the direction opposite to the second direction DR2. For example, the bending region BR may be connected to the main region MR through a lower short side of the main region MR. Thus, the bending region BR may be connected to the edge of the first side display area DA1. The first side display area DA1 may be disposed between the front display area DA0 and the bending region BR. The display panel 10 may be bent in a direction opposite to the third direction DR3 from the first bending line BL1 and may be bent in the third direction DR3 from the bending region BR. The display panel 10 may be bent with a constant radius of curvature from the first bending line BL1 and the bending area BR, respectively. However, the disclosure may not be limited thereto. For example, the display panel 10 may have a different radius of curvature for each section. In a case that the display panel 10 may bent from the first bending line BL1 and the bending region BR, the surface of the display panel 10 may be reversed. For example, one surface of the display panel 10 facing upward may be changed to face outward through the first bending line BL1 and then to face downward through the bending region BR.

The sub-region SR may extend from the bending region BR. The sub-region SR may extend in a direction parallel to the main region MR from a point where bending may be completed. The sub-region SR may overlap or face the main region MR in the third direction DR3, i.e., in a thickness direction of the display panel 10. The width of the sub-region SR (e.g., the width in the second direction DR2) may be the same as the width of the bending region BR.

A driving chip IC may be disposed in the sub-region SR. The driving chip IC may include an integrated circuit for driving the display panel 10. The integrated circuit may be provided as a separate chip or may be integrated into one chip.

A pad portion may be disposed at an end portion of the sub-region SR of the display panel 10. The pad portion may include display signal wiring pads and touch signal wiring pads. A driving substrate FPC may be connected to the pad portion of the end portion of the sub-region SR of the display panel 10. The driving substrate FPC may be a flexible printed circuit board or film.

The display panel 10 may include protective films PF1 and PF2 disposed on one surface of the substrate 100. The protective films PF1 and PF2 may include a first protective film PF1 attached on the main region MR of the substrate 100 and a second protective film PF2 attached on the sub-region SR of the substrate 100. The first protective film PF1 may be exclusively disposed only in the main region MR. For example, the first protective film PF1 may not overlap or face the bending region BR and the sub-region SR. Further, the second protective film PF2 may be exclusively disposed only in the sub-region SR. For example, the second protective film PF2 may not overlap or face the main region MR and the bending region BR. The substrate 100 and the first protective film PF1 may be coupled through a first adhesive layer PSA1, and the substrate 100 and the second protective film PF2 may be coupled through a second adhesive layer PSA2. In a case that the substrate 100 may be bent, the first protective film PF1 and the second protective film PF2 may overlap or face each other in the thickness direction. The first protective film PF1 and the second protective film PF2 may be coupled through a third adhesive layer PSA3. Accordingly, the substrate 100 may be bent to adhere the first protective film PF1 and the second protective film PF2 via the third adhesive layer PSA3.

The display panel 10 may include cutout portions CA formed by cutting the corner areas C1, C2, C3 and C4 in the thickness direction. The cutout portions CA may be located in the first to fourth corner areas C1, C2, C3 and C4, respectively. A description regarding the first corner area C1, and which is similar to the remaining corner areas C2, C3, and C4, follows below.

The first protective film PF1 may include a cutout pattern C_PF1 overlapping or facing the cutout portion CA. The cutout pattern C_PF1 of the first protective film PF1 may cut the first corner area C1 of the first protective film PF1 in the thickness direction. The cutout pattern C_PF1 of the first protective film PF1 may completely cut the first protective film PF1 in the thickness direction to expose a portion of the substrate 100 disposed on the first protective film PF1. Although FIG. 7 illustrates a case where the cutout pattern C_PF1 of the first protective film PF1 may completely cut the first protective film PF1 in the thickness direction, the disclosure may not be limited thereto. For example, the cutout pattern C_PF1 of the first protective film PF1 may have a groove shape to partially cut the first protective film PF1. The groove may have various shapes such as a conical shape, a polypyramid shape, a cylindrical shape and a polyprism shape.

The first adhesive layer PSA1 may include a cutout pattern C_PSA1 overlapping or facing the cutout portion CA. The cutout pattern C_PSA1 of the first adhesive layer PSA1 may overlap or face the cutout pattern C_PF1 of the first protective film PF1. The width of the cutout pattern C_PSA1 of the first adhesive layer PSA1 may be substantially the same as the width of the cutout pattern C_PF1 of the first protective film PF1. The side surface of the cutout pattern C_PSA1 of the first adhesive layer PSA1 may be aligned with the side surface of the cutout pattern C_PF1 of the first protective film PF1.

As described above, in a case that the display panel 10 may include the cutout pattern C_PF1 which may cut the corner areas C1, C2, C3 and C4 of the first protective film PF1 in the thickness direction, bending of the corner areas C1, C2, C3 and C4 of the display panel 10 may be facilitated. Accordingly, in a case that the display panel 10 may be attached to the cover window 20, based on the corner areas C1, C2, C3 and C4 of the display panel 10 being easily attachable to the curved corner portions of the cover window 20, it may be possible to prevent or minimize non-bonding defects and bubble defects at the corner areas C1, C2, C3 and C4.

Figure 8:
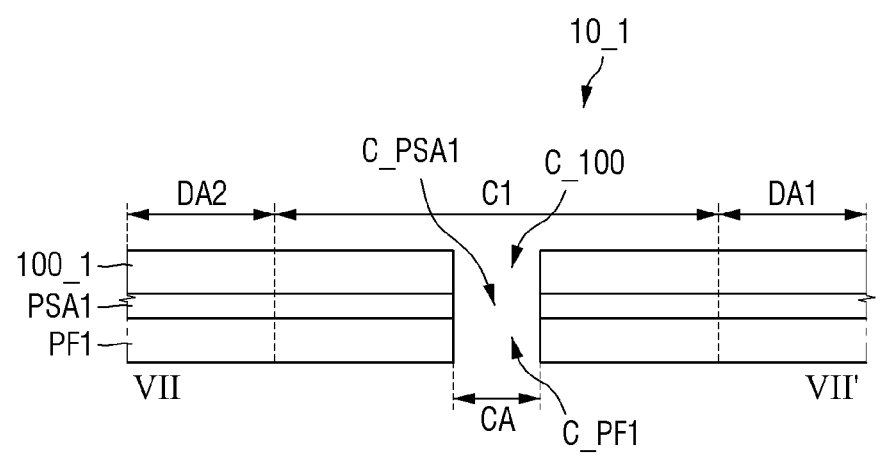
FIG. 8 shows a schematic cross-sectional view of a display panel according to another embodiment.

FIG. 8 shows a schematic cross-sectional view of a display panel according to another embodiment.

Referring to FIG. 8, a substrate 100_1 of a display panel 10_1 according to the embodiment may include a cutout pattern C_100 overlapping or facing the cutout portion CA. The cutout pattern C_100 of the substrate 100_1 may cut the first corner area C1 of the substrate 100_1 in the thickness direction. The cutout pattern C_100 of the substrate 100_1 may completely cut the substrate 100_1 in the thickness direction. Although FIG. 8 illustrates a case where the cutout pattern C_100 of the substrate 100_1 may completely cut the substrate 100_1 in the thickness direction, the disclosure may not be limited thereto. For example, the cutout pattern C_100 of the substrate 100_1 may have a groove shape to partially cut the substrate 100_1. The groove may have various shapes such as a conical shape, a polypyramid shape, a cylindrical shape and a polyprism shape.

The cutout pattern C_100 of the substrate 100_1 may overlap or face the cutout pattern C_PF1 of the first protective film PF1. The width of the cutout pattern C_100 of the substrate 100_1 may be substantially the same as the width of the cutout pattern C_PF1 of the first protective film PF1. The side surface of the cutout pattern C_100 of the substrate 100_1 may be aligned with the side surface of the cutout pattern C_PF1 of the first protective film PF1.

The cutout pattern C_100 of the substrate 100_1 may overlap or face the cutout pattern C_PSA1 of the first adhesive layer PSA1. The width of the cutout pattern C_100 of the substrate 100_1 may be substantially the same as the width of the cutout pattern C_PSA1 of the first adhesive layer PSA1. The side surface of the cutout pattern C_100 of the substrate 100_1 may be aligned with the side surface of the cutout pattern C_PSA1 of the first adhesive layer PSA1.

As described above, in a case that the display panel 10_1 may include the cutout pattern C_PF1 which may cut the corner areas C1, C2, C3 and C4 of the first protective film PF1 in the thickness direction, bending of the corner areas C1, C2, C3 and C4 of the display panel 10 may be facilitated. Accordingly, in a case that the display panel 10 may be attached to the cover window 20, based on the corner areas C1, C2, C3 and C4 of the display panel 10 being easily attachable to the curved corner portions of the cover window 20, it may be possible to prevent or minimize non-bonding defects and bubble defects.

Figure 9:
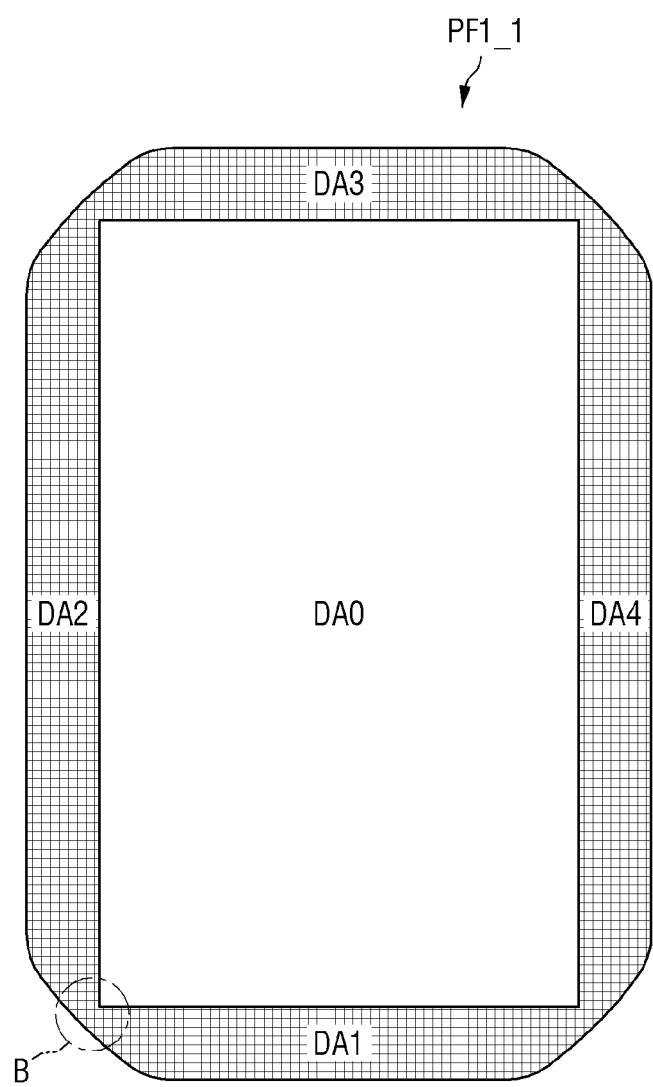
FIG. 9 shows a plan view of a first protective film according to still another embodiment.
Figure 10:
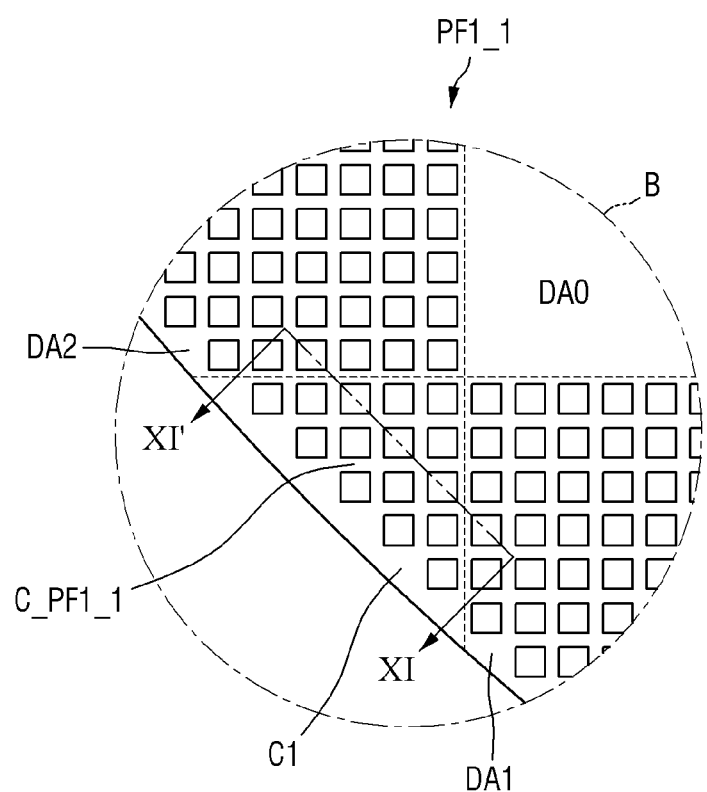
FIG. 10 shows an enlarged plan view of region B of FIG. 9.
Figure 11:
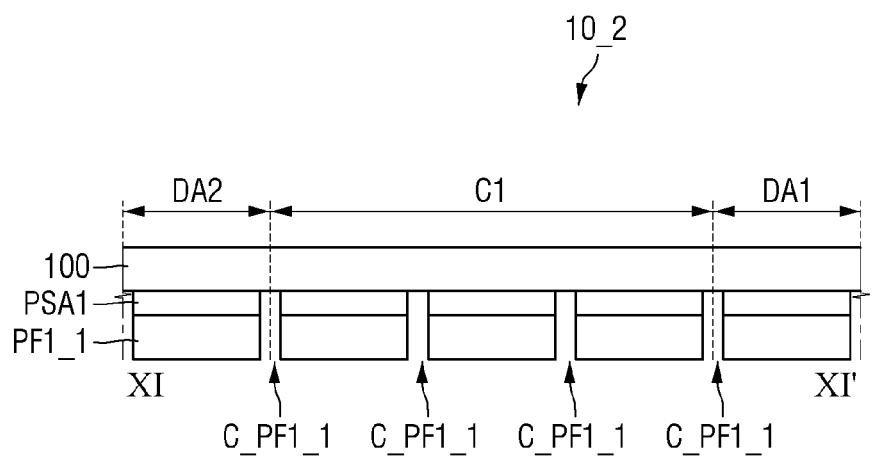
FIG. 11 shows a schematic cross-sectional view taken along line XI-XI' of FIG. 9.

FIG. 9 shows a plan view of a first protective film according to still another embodiment. FIG. 10 shows an enlarged plan view of region B of FIG. 9. FIG. 11 shows a schematic cross-sectional view taken along line XI-XI' of FIG. 9.

Referring to FIGS. 9 to 11, a first protective film PF1_1 of a display panel 10_2 according to the embodiment may be different from the embodiments of FIGS. 1 to 8 in that a cutout pattern C_PF1_1 may be formed in the side display areas DA1, DA2, DA3 and DA4 and the corner areas C1, C2, C3 and C4.

The cutout pattern C_PF1_1 of the first protective film PF1_1 may be disposed over the first to fourth side display areas DA1, DA2, DA3 and DA4 and the first to fourth corner areas C1, C2, C3 and C4. The cutout pattern C_PF1_1 of the first protective film PF1_1 may not be disposed in the front display area DA0. For example, the cutout pattern C_PF1_1 of the first protective film PF1_1 may not overlap or face the front display area DA0. A description with respect to the cutout pattern C_PF1_1 of the first protective film PF1_1, relative to the first side display area DA1, the second side display area DA2, and the first corner area C1 disposed between the first side display area DA1 and the second side display area DA2, follows below.

The cutout pattern C_PF1_1 of the first protective film PF1_1 may have a grid pattern shape to cut the first side display area DA1, the second side display area DA2, and the first corner area C1 in the thickness direction. For example, the cutout pattern C_PF1_1 of the first protective film PF_1 may have a grid pattern shape including a multiple cutting lines. The cutout pattern C_PF1_1 of the first protective film PF_1 may be a grid pattern including multiple first cutting lines extending in one direction and multiple second cutting lines extending in another direction. Further, the one direction and the another direction may be orthogonal to each other. In a case that the cutout pattern C_PF1_1 of the first protective film PF1_1 may have a grid pattern shape including multiple cutting lines, the cutting area of the first protective film PF1_1 may increase, thereby further facilitating the bending of the corner areas C1, C2, C3 and C4 and the side display areas DA1, DA2, DA3 and DA4 of the first protective film PF1_1. This increase may result as the cutout pattern C_PF1_1 of the first protective film PF1_1 may extend from one side of a given corner to another side of such corner, and wherein the sides may represent ends of such given corner.

The cutout pattern C_PF1_1 may completely cut the first protective film PF1_1 in the thickness direction to expose a portion of the substrate 100 disposed on the first protective film PF1_1. Although FIG. 11 illustrates a case where the cutout pattern C_PF1_1 of the first protective film PF1_1 completely cuts the first protective film PF1_1 in the thickness direction, the disclosure may not be limited thereto. For example, the cutout pattern C_PF1_1 of the first protective film PF1_1 may have a groove shape to partially cut the first protective film PF1_1. The groove may have various shapes such as a conical shape, a polypyramid shape, a cylindrical shape and a polyprism shape.

The first adhesive layer PSA1 may include a cutout pattern corresponding to the cutout pattern C_PF1_1 of the first protective film PF1_1. For example, the cutout pattern of the first adhesive layer PSA1 may overlap or face the cutout pattern C_PF1_1 of the first protective film PF1_1. The width of the cutout pattern of the first adhesive layer PSA1 may be substantially the same as the width of the cutout pattern C_PF1_1 of the first protective film PF1_1. The side surface of the cutout pattern of the first adhesive layer PSA1 may be aligned with the side surface of the cutout pattern C_PF1_1 of the first protective film PF1_1.

As described above, in a case that the first protective film PF1_1 of the display panel 10_2 may include the cutout pattern C_PF1_1 which may cut not only the corner areas C1, C2, C3 and C4 but also the side display areas DA1, DA2, DA3 and DA4, bending of the side display areas DA1, DA2, DA3 and DA4 may be facilitated. In a case that the cutout pattern C_PF1_1 of the first protective film PF1_1 may have a grid pattern shape including multiple cutting lines, the cutting area of the first protective film PF1_1 may increase, such that the bending of the corner areas C1, C2, C3 and C4 and the side display areas DA1, DA2, DA3 and DA4 of the first protective film PF1_1 may be further facilitated. This increase may result as the cutout pattern C_PF1_1 of the first protective film PF1_1 may extend from one side of a given corner to another side of such corner, and wherein the sides may represent ends of such given corner. Therefore, in a case that the display panel 10 may be attached to the cover window 20, based on the corner areas C1, C2, C3 and C4 of the display panel 10 being easily attachable to the curved corner portions of the cover window 20, it may be possible to prevent or minimize non-bonding defects and bubble defects.

Figure 12:
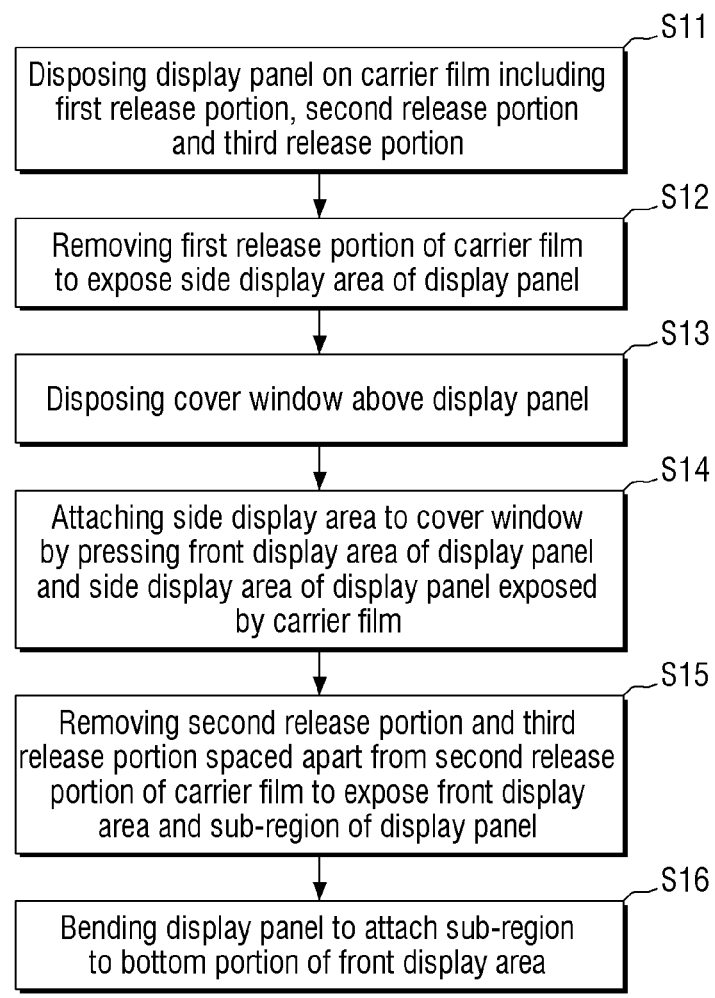
FIG. 12 shows a flowchart illustrating steps of a method of manufacturing a display device according to an embodiment.
Figure 13:
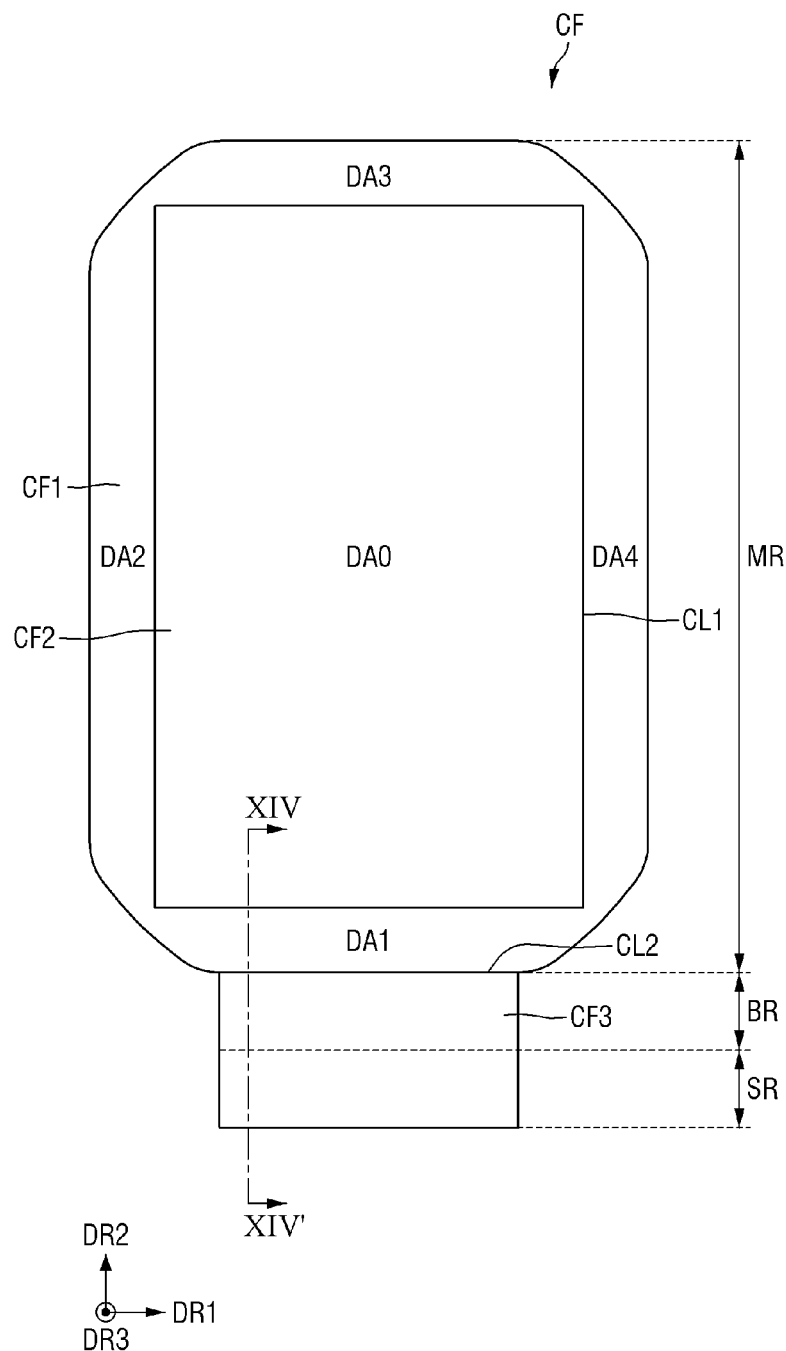
FIG. 13 shows a plan view of a carrier film according to an embodiment.

Among the display devices according to various embodiments, a method of manufacturing the display device of FIGS. 1 to 7 follows below. FIG. 12 shows a flowchart illustrating steps of a method of manufacturing a display device according to an embodiment. FIG. 13 shows a plan view of a carrier film according to an embodiment. FIGS. 14 to 18 show schematic cross-sectional views showing steps of a method of manufacturing a display device according to an embodiment.

Referring to FIG. 12, a method of manufacturing a display device according to an embodiment may include disposing a display panel on a carrier film including a first release portion, a second release portion and a third release portion (S11), removing the first release portion of the carrier film to expose side display areas of the display panel (S12), disposing a cover window above the display panel (S13), attaching the side display areas to the cover window by pressing a front display area of the display panel and the side display areas of the display panel exposed by the carrier film (S14), removing the second release portion and the third release portion spaced apart from the second release portion of the carrier film to expose the front display area and a sub-region of the display panel (S15), and bending the display panel to attach the sub-region to a bottom portion of the front display area (S16).

Figure 14:
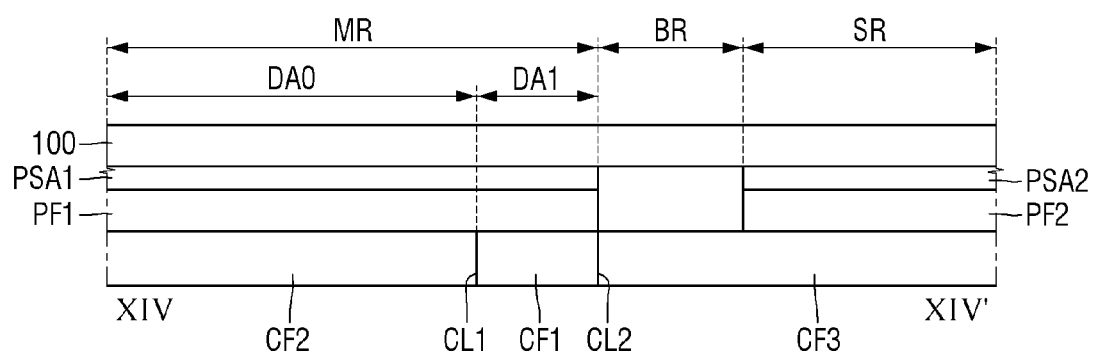
FIGS. 14 to 18 show schematic cross-sectional views showing steps of a method of manufacturing a display device according to an embodiment.

Referring to FIGS. 12 to 14, in a method of manufacturing a display device according to an embodiment, the display panel 10 may be disposed on a carrier film CF including a first release portion CF1, a second release portion CF2 and a third release portion CF3 (S11). As described above, the display panel 10 may include the front display area DA0, the side display areas DA1, DA2, DA3 and DA4, the corner areas C1, C2, C3 and C4, the bending region BR and the sub-region SR. Although not illustrated in the drawings, the display panel 10 disposed on the carrier film CF may be substantially the same as the display panel 10 described with reference to FIGS. 1 to 8. For example, the display panel 10 may include the cutout patterns C_PF1, C_PSA1 and C_100 formed in the corner areas C1, C2, C3 and C4. Disposing the display panel 10 may further include cutting the corner areas C1, C2, C3 and C4 in the thickness direction to form the cutout patterns C_PF1, C_PSA1 and C_100.

The carrier film CF may include the first release portion CF1 overlapping or facing the side display areas DA1, DA2, DA3 and DA4 and the corner areas C1, C2, C3 and C4 of the display panel 10, the second release portion CF2 overlapping or facing the front display area DA0 and the third release portion CF3 overlapping or facing the bending region BR and the sub-region SR.

Referring to FIG. 13, the second release portion CF2 and the third release portion CF3 of the carrier film CF may be spaced apart from each other in plan view, and the first release portion CF1 may be disposed between the second release portion CF2 and the third release portion CF3. The first release portion CF1, the second release portion CF2 and the third release portion CF3 of the carrier film CF may be distinguished by forming cutting lines CL1 and CL2 on the carrier film CF. For example, each release portion may be distinguished by forming a first cutting line CL1 between the first release portion CF1 and the second release portion CF2 of the carrier film CF and forming a second cutting line CL2 between the first release portion CF1 and the third release portion CF3 of the carrier film CF.

The first cutting line CL1 may be formed by cutting the carrier film CF along the edges of the front display area DA0. For example, the first cutting line CL1 may be formed by cutting the carrier film CF along boundaries between the front display area DA0 and the side display areas DA1, DA2, DA3 and DA4. The first cutting line CL1 may be formed by cutting the carrier film CF along the bending lines BL1, BL2, BL3 and BL4 described with reference to FIG. 4.

The second cutting line CL2 may be formed by cutting the carrier film CF along the edge of the first side display area DA1. For example, the second cutting line CL2 may be formed by cutting the carrier film CF along the boundary between the first side display area DA1 and the bending region BR.

Formation of the first cutting line CL1 and the second cutting line CL2 may be performed while the display panel 10 may be disposed on the carrier film CF. As another example, the first cutting line CL1 and the second cutting line CL2 may be formed first, and then the display panel 10 may be disposed thereon.

Figure 15:
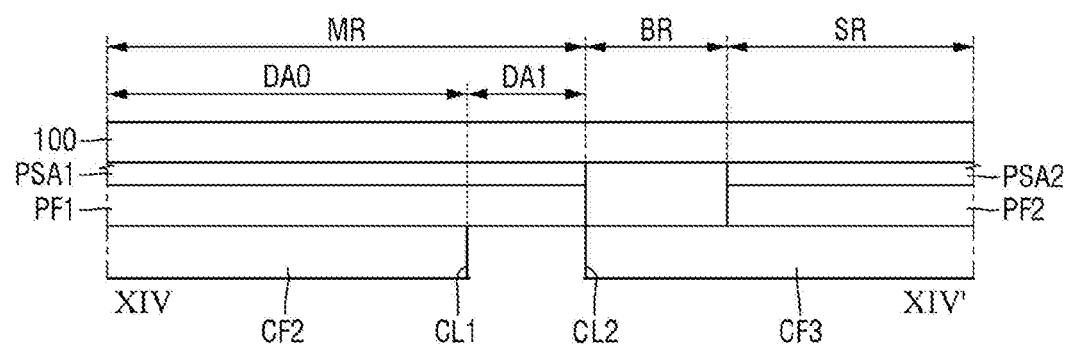

Referring to FIGS. 12 and 15, the first release portion CF1 of the carrier film CF may be removed to expose the side display areas DA1, DA2, DA3 and DA4 of the display panel 10 (S12).

Figure 16:
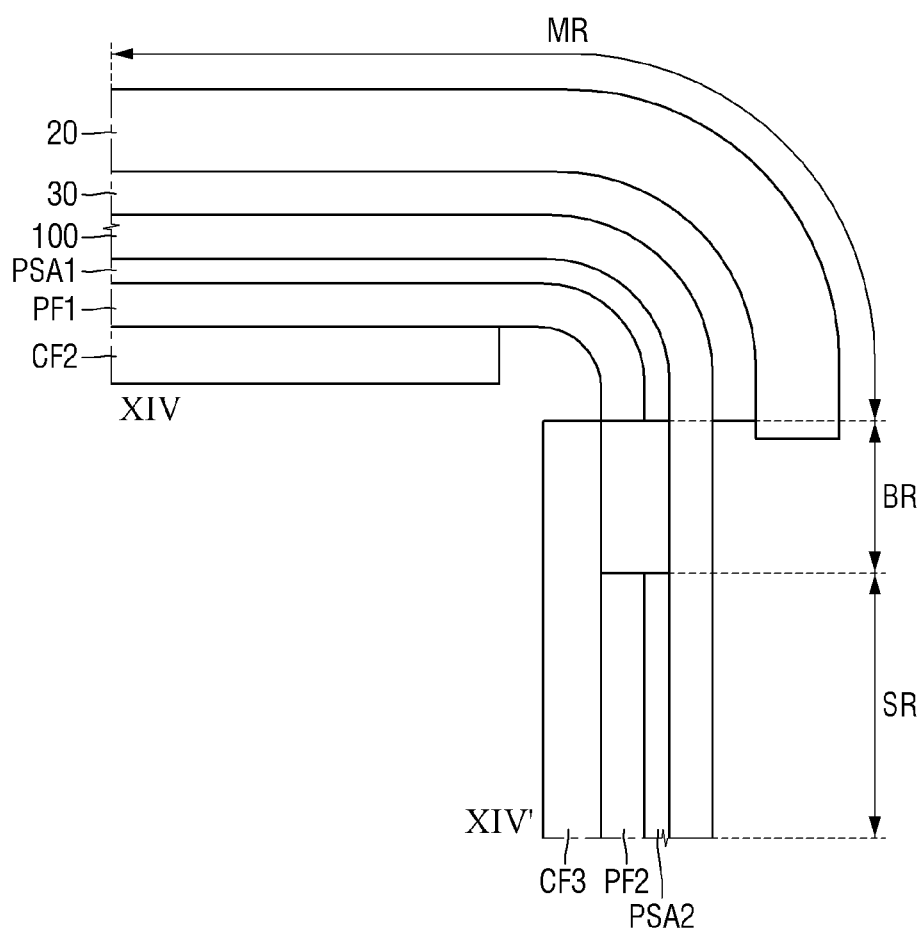
Figure 17:
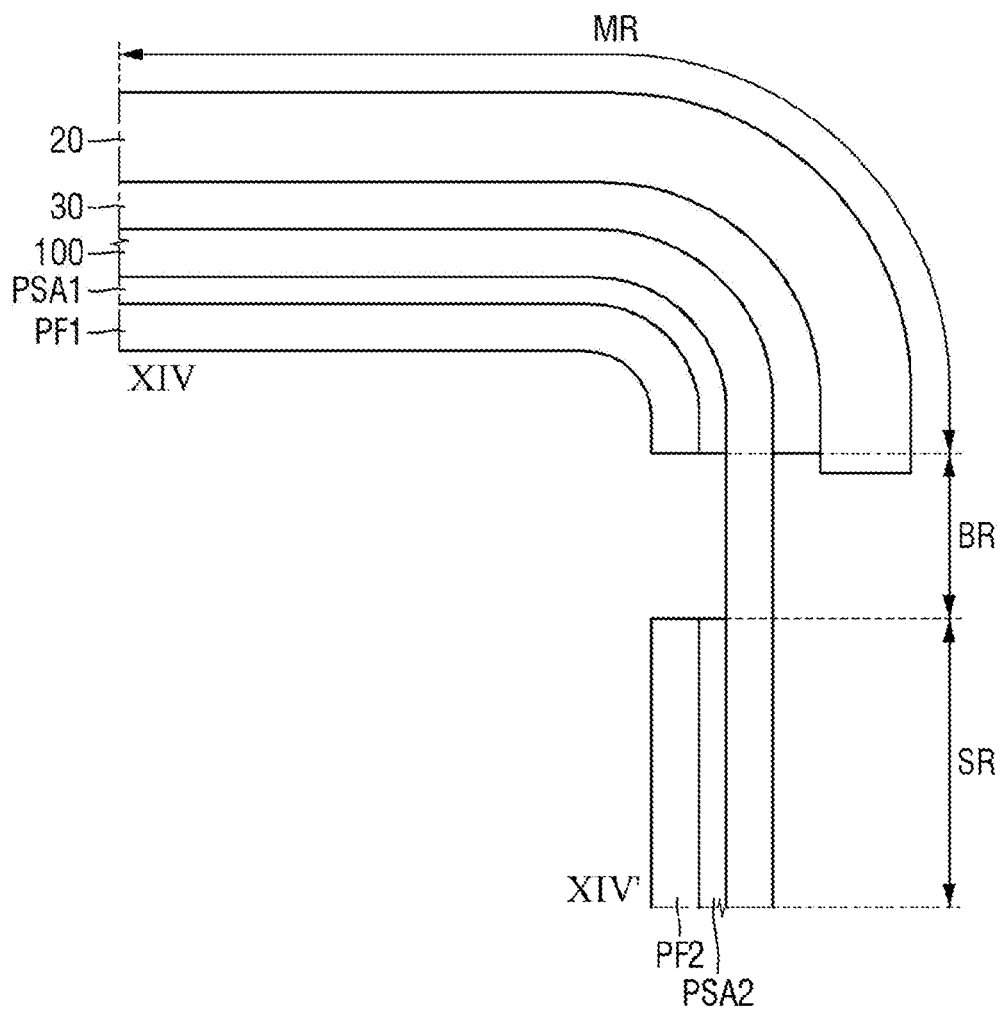

Referring to FIGS. 12, 16 and 17, the cover window 20 may be disposed on the display panel 10 (S13), and the side display areas DA1, DA2, DA3 and DA4 may be attached to the cover window 20 by pressing the front display area DA0 of the display panel 10 and the side display areas DA1, DA2, DA3 and DA4 of the display panel 10 exposed by the carrier film CF (S14). In other words, the side display areas DA1, DA2, DA3 and DA4 may be attached to the cover window 20 by pressing the front display area DA0 of the display panel 10 and the side display areas DA1, DA2, DA3 and DA4 of the display panel 10 together once the first release portion CF1 is removed. Once the above-described adhesive member 30 may be disposed between the cover window 20 and the display panel 10, the cover window 20 and the display panel 10 may be attached to each other by pressing the display panel 10 toward the cover window 20. The cover window 20 may include curved corner portions corresponding to the side display areas DA1, DA2, DA3 and DA4 and the corner areas C1, C2, C3 and C4 of the display panel 10. A sufficient pressure may be required in order for the side display areas DA1, DA2, DA3 and DA4 and the corner areas C1, C2, C3 and C4 of the display panel 10 to be attached to the curved corner portions of the cover window 20. As described above, in a case that a portion of the carrier film CF, i.e., the first release portion CF1, may be removed, a sufficient pressure may be delivered to the side display areas DA1, DA2, DA3 and DA4 and the corner areas C1, C2, C3 and C4 of the display panel 10. Accordingly, the side display areas DA1, DA2, DA3 and DA4 and the corner areas C1, C2, C3 and C4 of the display panel 10 may be easily bent and attached to the curved corner portions of the cover window 20. Thus, it may be possible to prevent or minimize non-bonding defects and bubble defects of the display device 10.

Referring to FIGS. 12 and 17, the second release portion CF2 and the third release portion CF3, which may be spaced apart from the second release portion CF2 of the carrier film CF, may be removed to expose the front display area DA0 and the sub-region SR of the display panel 10 (S15). The second release portion CF2 and the third release portion CF3 may be simultaneously removed as shown in FIG. 17, however the disclosure may not be limited thereto. For example, other steps may be performed between the removal of the second release portion CF2 and the removal of the third release portion CF3.

By peeling off the second release portion CF2 of the carrier film CF, an underside bottom surface of the bottom portion of the front display area DA0 of the display panel 10 overlapping or facing the second release portion CF2 may be exposed to the outside. For example, the underside bottom surface of the front display area DA0 and the first protective film PF1 overlapping or facing the second release portion CF2 may be exposed to the outside by peeling off the second release portion CF2. The underside bottom surface of the front display area DA0 and the first protective film PF1 that may be exposed due to the peeling of the second release portion CF2 may be combined with the second protective film PF2. In other words, the first protective film PF1, the bottom portion of the front display area DA0, and the second protective film PF2 may be attached to each other.

By peeling off the third release portion CF3 of the carrier film CF, an underside bottom surface of the bottom portion of the sub-region SR of the display panel 10 overlapping the third release portion CF3 may be exposed to the outside. For example, the underside bottom surface of the sub-region SR and the second protective film PF2 overlapping or facing the third release portion CF3 may be exposed to the outside by peeling off the third release portion CF3. The underside bottom surface of the sub-region SR and the second protective film PF2 that is exposed due to the peeling of the third release portion CF3 may be combined with the first protective film PF1. In other words, as described above the first protective film PF1, the bottom portion of the front display area DA0, the second protective film PF2, and the bottom portion of the sub-region SR may be attached to each other.

Figure 18:
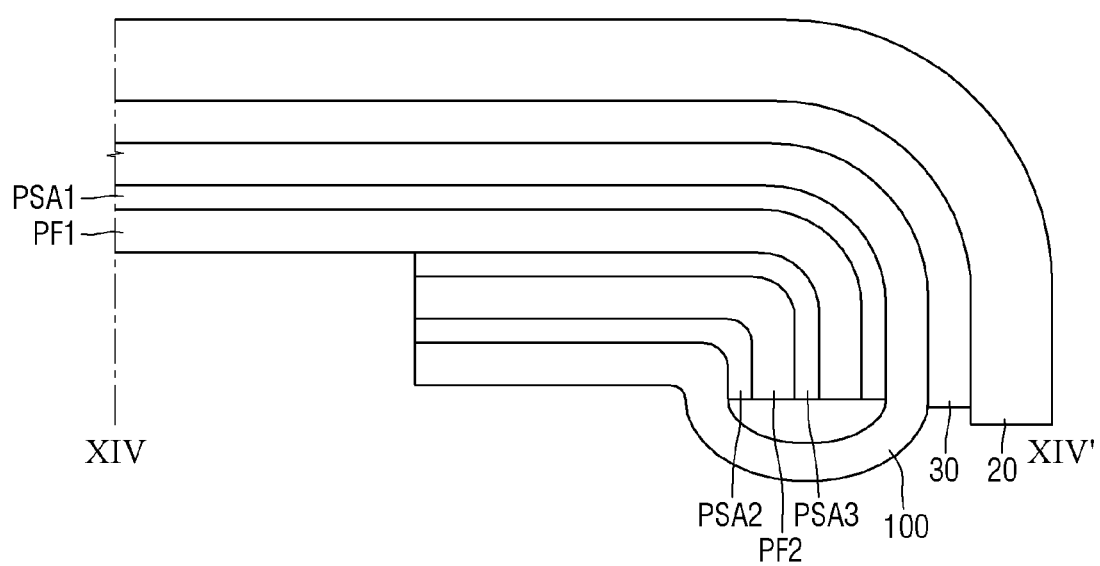

Referring to FIGS. 12 and 18, the display panel 10 may be bent to attach the sub-region SR to the bottom portion of the front display area DA0 of the display panel 10 (S16). In doing so, the surface of the display panel 10 may be reversed as the display panel 10 may be bent in the bending region BR. For example, as the display panel 10 may be bent, the first protective film PF1 and the second protective film PF2 may overlap each other in the thickness direction. Accordingly, the bottom surface of the sub-region SR corresponding to the second protective film PF2 may face the bottom surface of the front display area DA0 corresponding to the first protective film PF1. One surface of the first protective film PF1 and one surface of the second protective film PF2 overlapping or facing each other may be coupled through the third adhesive layer PSA3 described above. Accordingly, the substrate 100 may be bent to adhere the first protective film PF1 and the second protective film PF2 via the third adhesive layer PSA3.

Among the display devices according to various embodiments, a method of manufacturing the display device of FIGS. 9 to 11 follows below.

Figure 19:
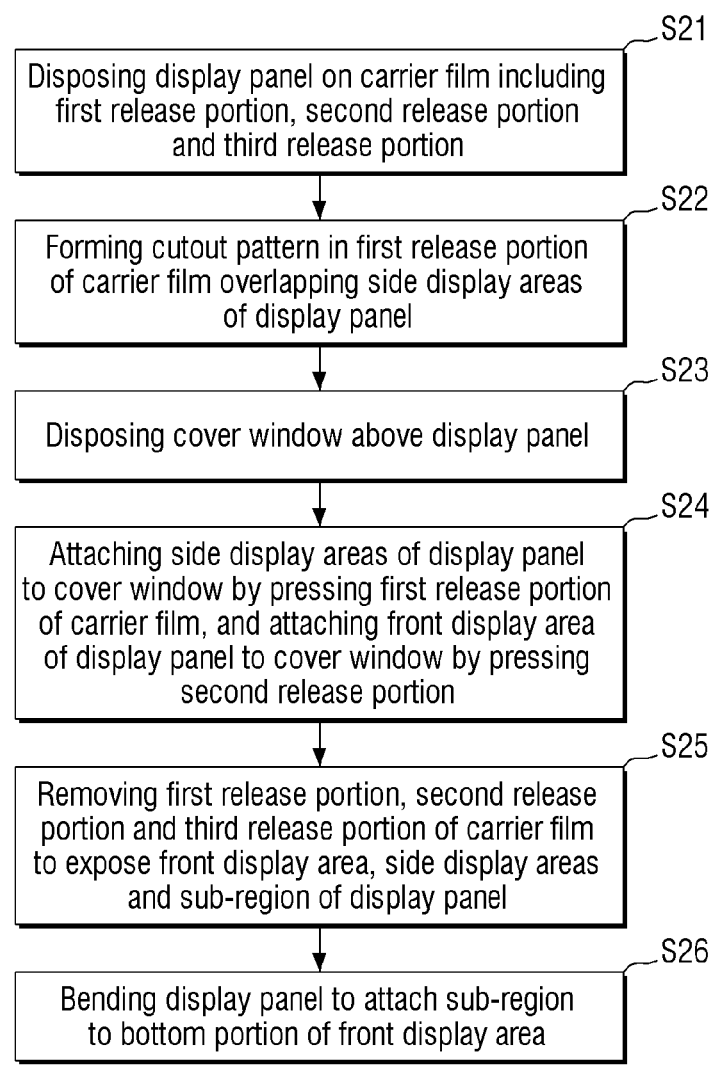
FIG. 19 shows a flowchart illustrating steps of a method of manufacturing a display device according to another embodiment.
Figure 20:
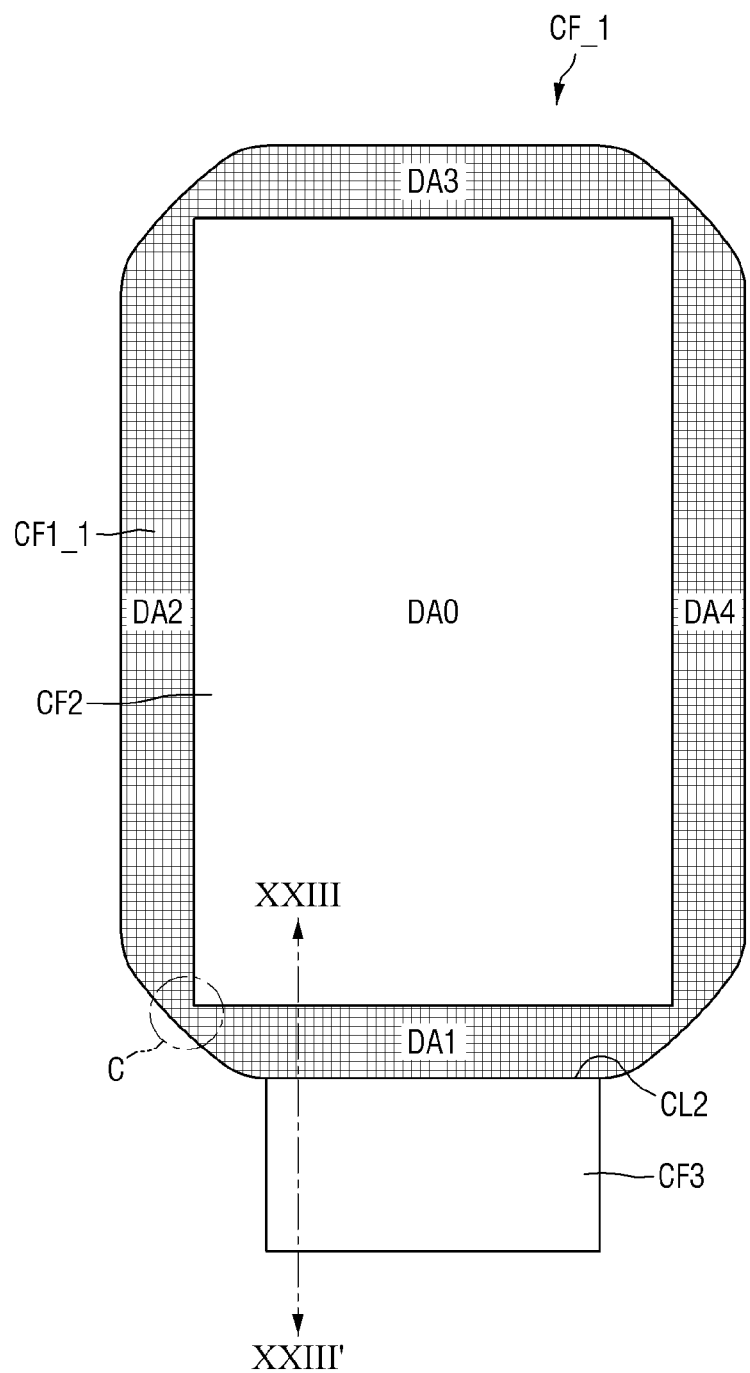
FIG. 20 shows a plan view of a carrier film according to another embodiment.
Figure 21:
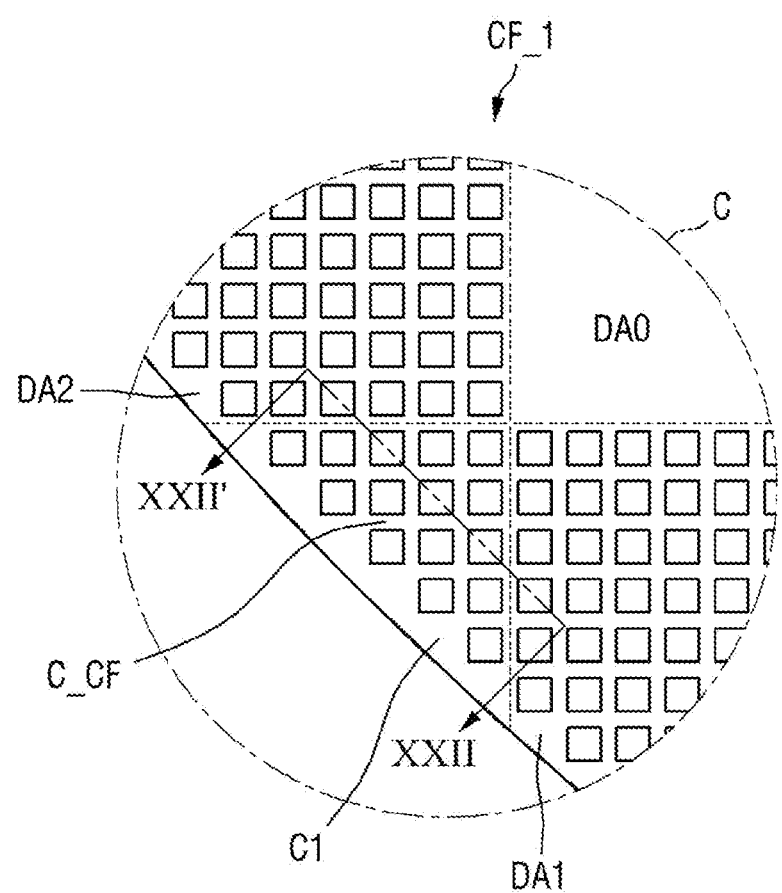
FIG. 21 shows an enlarged plan view of region C of FIG. 20.
Figure 22:
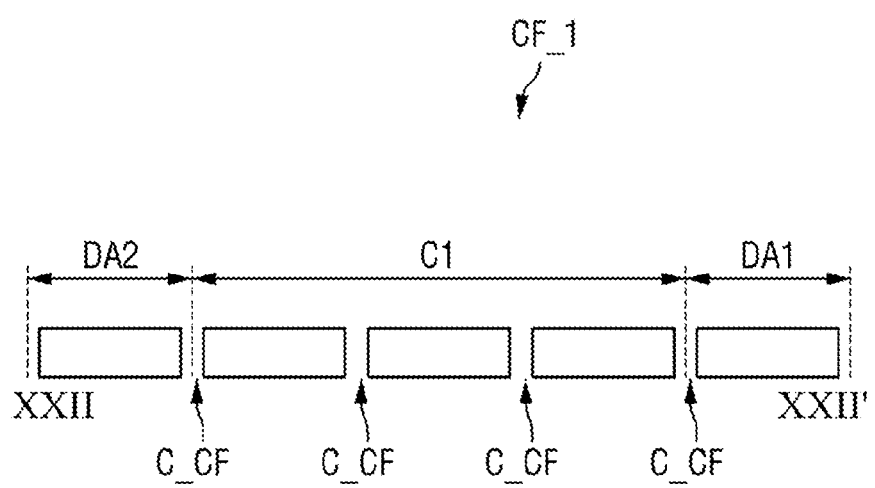
FIG. 22 shows a schematic cross-sectional view taken along line XXII-XXII' of FIG. 21.
Figure 23:
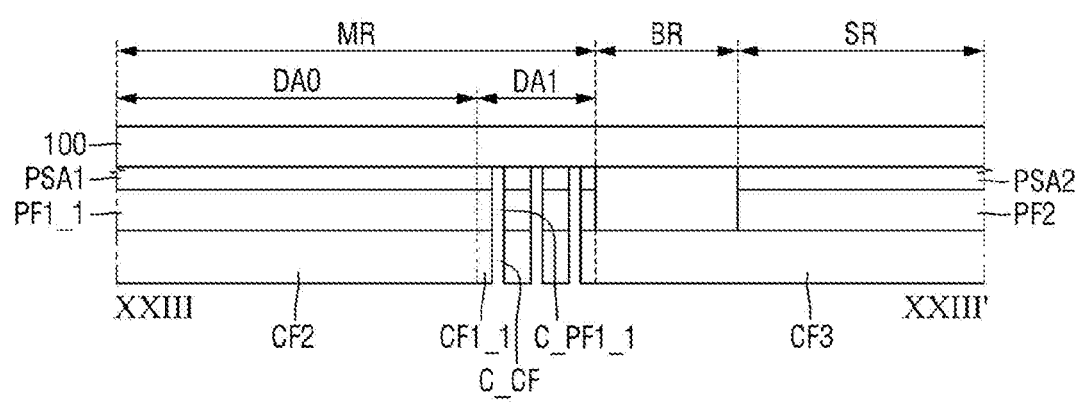
FIGS. 23 to 26 shows schematic cross-sectional views showing steps of a method of manufacturing a display device according to another embodiment.

FIG. 19 shows a flowchart illustrating steps of a method of manufacturing a display device according to another embodiment. FIG. 20 shows a plan view of a carrier film according to another embodiment. FIG. 21 shows an enlarged plan view of region C of FIG. 20. FIG. 22 shows a schematic cross-sectional view taken along line XXII-XXII' of FIG. 21. FIGS. 23 to 26 show schematic cross-sectional views showing steps of a method of manufacturing a display device according to another embodiment.

Referring to FIG. 19, a method of manufacturing a display device according to the embodiment may include disposing a display panel on a carrier film including a first release portion, a second release portion and a third release portion (S21), forming a cutout pattern in the first release portion of the carrier film overlapping or facing the side display areas of the display panel (S22), disposing a cover window above the display panel (S23), attaching the side display areas of the display panel to the cover window by pressing the first release portion of the carrier film, and attaching the front display area of the display panel to the cover window by pressing the second release portion (S24), removing the first release portion, the second release portion and the third release portion of the carrier film to expose the front display area, the side display areas and the sub-region of the display panel (S25), and bending the display panel to attach the sub-region of the display panel to a bottom portion of a main region (S26).

Referring to FIGS. 19 to 23, in a method of manufacturing a display device according to the present embodiment, the display panel may be disposed on a carrier film CF_1. The carrier film CF_1 may include a first release portion CF1_1, a second release portion CF2 and a third release portion CF3 (S21). A cutout pattern C_CF may be formed in the first release portion CF1_1 of the carrier film CF_1 overlapping or facing the side display areas DA1, DA2, DA3 and DA4 of the display panel (S22).

As described above, the display panel may include the front display area DA0, the side display areas DA1, DA2, DA3 and DA4, the corner areas C1, C2, C3 and C4, the bending region BR and the sub-region SR. Although not illustrated in the drawings, the display panel disposed on the carrier film CF_1 may be substantially the same as the display panel 10_2 described with reference to FIGS. 9 to 11. For example, the display panel 10_2 may include a cutout pattern C_PF1_1 formed in the side display areas DA1, DA2, DA3 and DA4 and the corner areas C1, C2, C3 and C4. Disposing the display panel 10_2 may further include cutting the side display areas DA1, DA2, DA3 and DA4 and the corner areas C1, C2, C3 and C4 in the thickness direction to form the cutout pattern C_PF1_1.

The carrier film CF_1 may include the first release portion CF1_1 overlapping or facing the side display areas DA1, DA2, DA3 and DA4 and the corner areas C1, C2, C3 and C4 of the display panel, the second release portion CF2 overlapping or facing the front display area DA0 and the third release portion CF3 overlapping or facing the bending region BR and the sub-region SR. The cutout pattern C_CF may be formed by cutting the first release portion CF1_1 of the carrier film CF_1 in the thickness direction. Forming the cutout pattern C_CF in the first release portion CF1_1 of the carrier film CF_1 may be performed simultaneously with forming the cutout pattern C_PF1_1 in the side display areas DA1, DA2, DA3 and DA4 and the corner areas C1, C2, C3 and C4 of the display panel 10_2. The cutout pattern C_CF of the first release portion CF1_1 may overlap or face the cutout pattern C_PF1_1 of the first protective film PF1_1. The width of the cutout pattern C_CF of the first release portion CF1_1 may be substantially the same as the width of the cutout pattern C_PF1_1 of the first protective film PF1_1. The side surface of the cutout pattern C_CF of the first release portion CF1_1 may be aligned with the side surface of the cutout pattern C_PF1_1 of the first protective film PF1_1.

A description of the cutout pattern C_CF of the first release portion CF1_1 follows below with reference to FIGS. 20 to 22.

Referring to FIGS. 20 to 22, the cutout pattern C_CF may be formed on the entire surface of the first release portion CF1_1. The cutout pattern C_CF of the first release portion CF1_1 may not be formed in a region other than the first release portion CF1_1. Thus, the cutout pattern C_CF may not be formed in the second release portion CF2 and the third release portion CF3.

A description regarding the first release portion CF1_1 overlapping or facing the first side display area DA1, the second side display area DA2, and the first corner area C1 disposed between the first side display area DA1 and the second side display area DA2 follows below, and may be illustrative of others of the corner areas C2, C3 and C4 relative to their respectively adjacent side display areas.

The cutout pattern C_CF of the first release portion CF1_1 may have a grid pattern shape to cut the first release portion CF1_1 of the carrier film CF_1 overlapping or facing the first side display area DA1, the second side display area DA2, and the first corner area C1 in the thickness direction. For example, the cutout pattern C_PF1_1 of the first release portion CF1_1 may have a grid pattern shape including a multiple cutting lines. The cutout pattern C_CF of the first release portion CF1_1 may be a grid pattern including multiple first cutting lines extending in one direction and multiple second cutting lines extending in another direction. The one direction and the another direction may be orthogonal to each other. In a case that the cutout pattern C_CF of the first release portion CF1_1 may have a grid pattern shape including multiple cutting lines, the cutting area of the first release portion CF1_1 may increase, thereby further facilitating the bending of the first release portion CF1_1. This increase may result as the cutout pattern C_PF1_1 of the first protective film PF1_1 may extend from one side of a given corner to another side of such corner, and wherein the sides may represent ends of such given corner.

Also, a pressure applied to the first release portion CF1_1 may be effectively delivered to the side display areas DA1, DA2, DA3 and DA4 and the corner areas C1, C2, C3 and C4 of the display panel 10_2.

The cutout pattern C_CF of the first release portion CF1_1 may completely cut the carrier film CF_1 in the thickness direction. Although FIG. 22 illustrates a case where the cutout pattern C_CF of the first release portion CF1_1 completely cuts the carrier film CF_1 in the thickness direction, the disclosure may not be limited thereto. For example, the cutout pattern C_CF of the first release portion CF1_1 may have a groove shape to partially cut the carrier film CF_1. The groove may have various shapes such as a conical shape, a polypyramid shape, a cylindrical shape and a polyprism shape.

As described above, in a case that the carrier film CF_1 may include the cutout pattern C_CF to cut the first release portion CF1_1, bending of the first release portion CF1_1 may be facilitated, and a pressure applied to the first release portion CF1_1 may be effectively delivered to the side display areas DA1, DA2, DA3 and DA4 and the corner areas C1, C2, C3 and C4 of the display panel. Accordingly, the side display areas DA1, DA2, DA3 and DA4 and the corner areas C1, C2, C3 and C4 of the display panel may be easily bent and attached to the curved corner portions of the cover window 20. Thus, it may be possible to prevent or minimize non-bonding defects and bubble defects of the display device 10_2.

Figure 24:
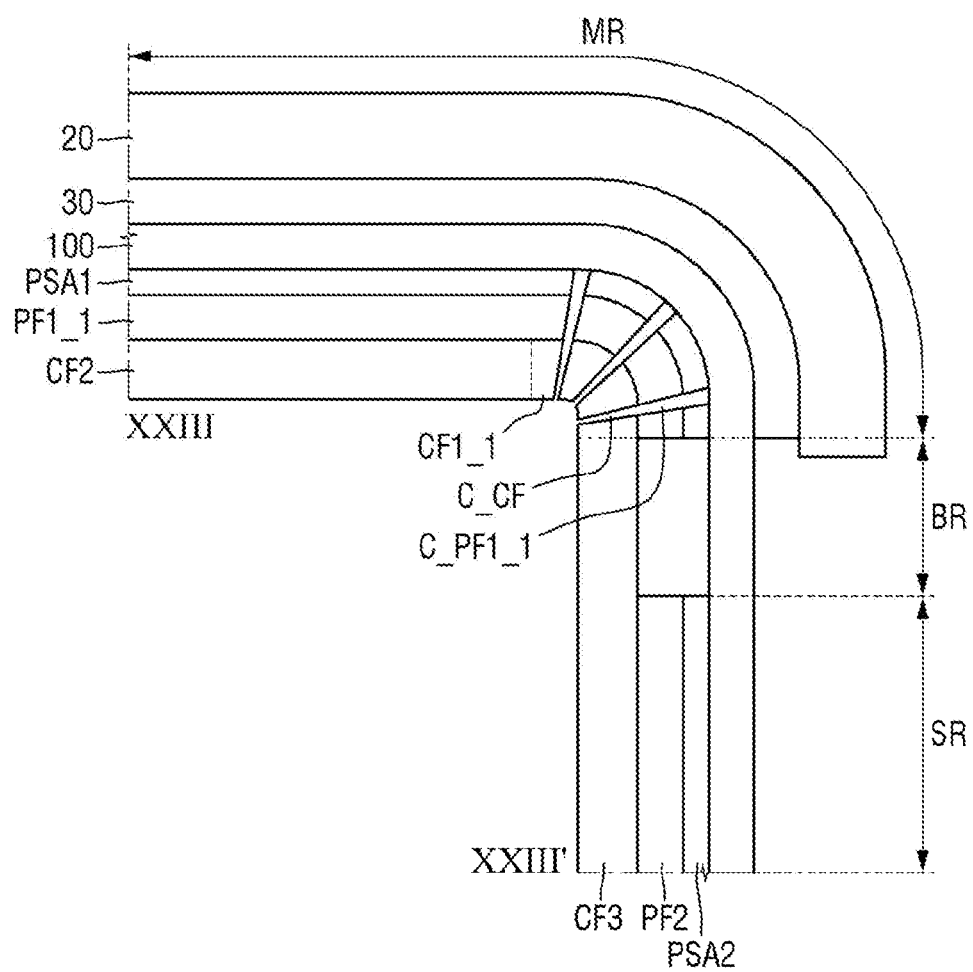

Referring to FIGS. 19 and 24, the cover window 20 may be disposed above the display panel 10_2 (S23). The side display areas DA1, DA2, DA3 and DA4 of the display panel 10_2 may be attached to the cover window 20 by pressing the first release portion CF1_1 of the carrier film CF_1 toward the cover window 20, and the front display area DA0 of the display panel 10_2 may be attached to the cover window 20 by pressing the second release portion CF2 toward the cover window (S24).

As described above, in a case that the cutout pattern C_CF may be formed in a portion of the carrier film CF_1, i.e., the first release portion CF1_1, the cutting area of the first release portion CF1_1 may increase, thereby further facilitating the bending of the first release portion CF1_1. This increase may result as the cutout pattern C_PF1_1 of the first protective film PF1_1 may extend from one side of a given corner to another side of such corner, and wherein the sides may represent ends of such given corner.

A pressure applied to the first release portion CF1_1 may also be effectively delivered to the side display areas DA1, DA2, DA3 and DA4 and the corner areas C1, C2, C3 and C4 of the display panel 10_2. For example, the side display areas DA1, DA2, DA3 and DA4 and the corner areas C1, C2, C3 and C4 of the display panel 10_2 may be easily bent and attached to the curved corner portions of the cover window 20, as described above.

Figure 25:
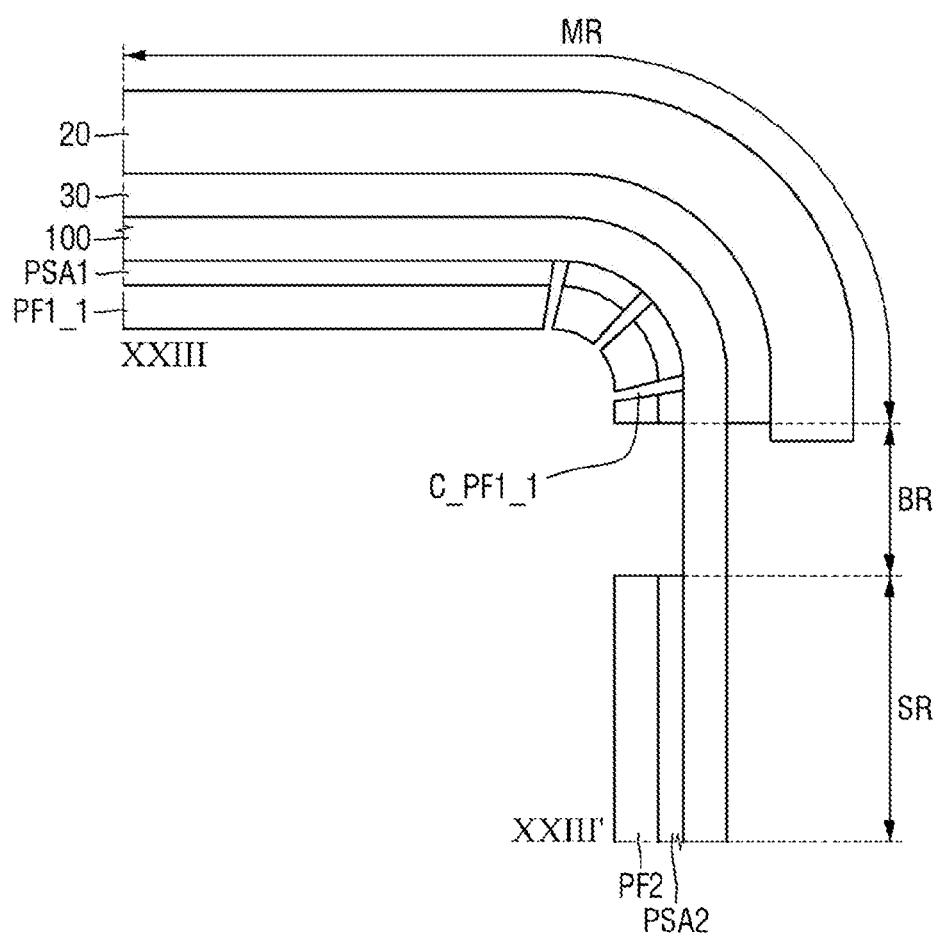

Referring to FIGS. 19 and 25, the first release portion CF1_1, the second release portion CF2 and the third release portion CF3 of the carrier film CF_1 may be removed to expose the front display area DA0, the side display areas DA1, DA2, DA3 and DA4 and the sub-region SR of the display panel 10_2 (S25).

The first release portion CF1_1, the second release portion CF2 and the third release portion CF3 may be simultaneously removed as shown in FIG. 25, but the disclosure may not be limited thereto. For example, other steps may be performed between the removal of each of the first release portion CF1_1, the second release portion CF2 and the third release portion CF3.

By peeling off the first release portion CF1_1 and the second release portion CF2 of the carrier film CF_1, the bottom portion of the side display areas DA1, DA2, DA3 and DA4 and the front display area DA0 of the display panel 10_2 overlapping or facing the first release portion CF1_1 and the second release portion CF2 may be exposed to the outside. For example, the underside bottom surface of the main region MR of the display panel 10_2 may be exposed to the outside by peeling off the first release portion CF1_1 and the second release portion CF2. The bottom surface of the first protective film PF1_1 that may be exposed due to the peeling of the first release portion CF1_1 and the second release portion CF2 may be combined with the second protective film PF2.

By peeling off the third release portion CF3 of the carrier film CF_1, the bottom portion of the sub-region SR of the display panel 10 overlapping or facing the third release portion CF3 may be exposed to the outside. For example, the underside bottom surface of the sub-region SR of the second protective film PF2 overlapping or facing the third release portion CF3 may be exposed to the outside by peeling off the third release portion CF3. As described above, the bottom surface of the sub-region SR of the second protective film PF2 that may be exposed due to the peeling of the third release portion CF3 may be combined with the first protective film PF1_1.

Figure 26:
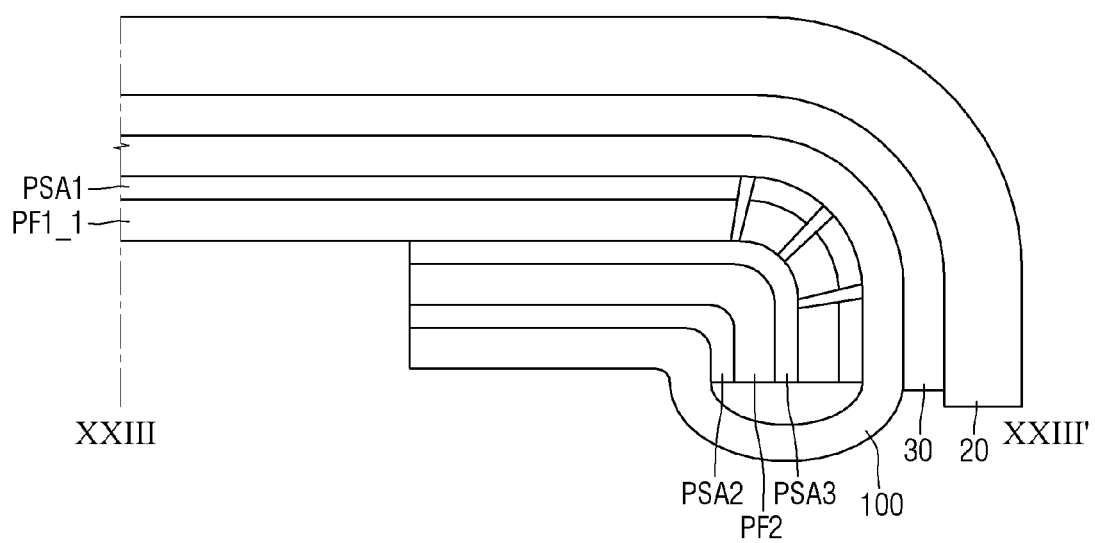

Referring to FIGS. 19 and 26, the display panel 10_2 may be bent to attach the sub-region SR of the display panel 10_2 to the bottom portion of the front display area DA0 (S26).

As described above, in a case that the display panel 10_2 may be bent in the bending region BR, the surface of the display panel 10 may be reversed, and the bottom surface of the sub-region SR of the second protective film PF2 may face the bottom surface of the front display area DA0 of the first protective film PF1_1. Thus, one surface of the first protective film PF1_1 and one surface of the second protective film PF2 facing each other may be coupled through the third adhesive layer PSA3 described above. Accordingly, the substrate 100 may be bent to adhere the first protective film PF1 and the second protective film PF2 via the third adhesive layer PSA3.

Those skilled in the art will appreciate that many variations and modifications can be made to the preferred embodiments without substantially departing from the principles of the present disclosure. Therefore, the disclosed embodiments of the invention may be used in a generic and descriptive sense only and not for purposes of limitation.

What is claimed is:
1. A display device, comprising:
   a display panel including;
      a front display area;
      a first side area extending from a first side of the front display area;
      a second side area extending from a second side of the front display area,
   the second side being adjacent to the first side:
      a corner area where the first side area and the second side area meet; and
      a cutout portion in the corner area, the cutout portion being an opening in the display panel in a thickness direction of the display panel, the cutout portion also extending in a direction from a closest corner of the front display area to an outer edge of the corner area in plan view.
2. The display device of claim 1, wherein the display panel further includes a substrate and a first protective film attached to a surface of the substrate, and the first protective film includes a cutout pattern overlapping the cutout portion.

3. The display device of claim 2, wherein the cutout pattern of the first protective film cuts the first protective film in the thickness direction of the display panel from one side of the corner area to another side of the corner area.

4. The display device of claim 3, wherein the one side of the corner area and the another side of the corner area respectively correspond to first and second ends of the corner area.

5. The display device of claim 2, wherein the substrate includes a cutout pattern overlapping the cutout portion.

6. The display device of claim 5, wherein the cutout pattern of the substrate cuts the substrate in the thickness direction of the display panel from a first end of the corner area to a second end of the corner area.

7. The display device of claim 2, wherein the cutout pattern of the first protective film overlaps the first side area and the second side area.

8. The display device of claim 7, wherein the cutout pattern of the first protective film is a cutout pattern having a grid configuration in plan view.

9. The display device of claim 2, wherein the display panel further includes a second protective film attached to a surface of the substrate, the substrate includes a bending region, a main region located at one side of the bending region, and a sub-region extending from another side of the bending region, and the first protective film is attached to the main region of the substrate, and the second protective film is attached to the sub-region of the substrate.

10. The display device of claim 9, wherein the second protective film overlaps the first protective film in the thickness direction of the display panel.

11. The display device of claim 10, wherein the display panel includes a first adhesive layer disposed between the substrate and the first protective film, a second adhesive layer disposed between the substrate and the second protective film, and a third adhesive layer disposed between the first protective film and the second protective film.

12. The display device of claim 1, wherein the cutout portion extends completely through the display panel, and the cutout portion extends at an incline angle relative to the first side of the front display area in plan view.

13. The display device of claim 1, wherein a middle portion of the first side area is flat, a middle portion of the second side area is flat, an end portion of the first side area bordering the corner portion is continuously tapered, an end portion of the second side area bordering the corner portion is continuously tapered.

* * * * *